United States Patent
Aritome

(10) Patent No.: US 8,854,891 B2
(45) Date of Patent: Oct. 7, 2014

(54) METHOD OF OPERATING SEMICONDUCTOR DEVICE

(75) Inventor: Seiichi Aritome, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 231 days.

(21) Appl. No.: 13/542,401

(22) Filed: Jul. 5, 2012

(65) Prior Publication Data

US 2013/0010548 A1 Jan. 10, 2013

(30) Foreign Application Priority Data

Jul. 6, 2011 (KR) .................. 10-2011-0067013
Jun. 26, 2012 (KR) .................. 10-2012-0068544

(51) Int. Cl.
*G11C 16/10* (2006.01)

(52) U.S. Cl.
USPC .............................. 365/185.19; 365/185.18

(58) Field of Classification Search
CPC .............................. G11C 16/10; G11C 16/34
USPC ............ 365/185.19, 185.15, 185.18, 185.28
See application file for complete search history.

(56) References Cited

U.S. PATENT DOCUMENTS

| 5,991,202 A * | 11/1999 | Derhacobian et al. ... 365/185.19 |
| 7,471,565 B2 | 12/2008 | Aritome |
| 7,561,469 B2 | 7/2009 | Aritome |
| 8,503,245 B2 * | 8/2013 | Yamada et al. .......... 365/185.19 |
| 2006/0092703 A1 * | 5/2006 | Chae et al. ................ 365/185.18 |
| 2007/0047314 A1 * | 3/2007 | Goda et al. ............... 365/185.18 |
| 2007/0258286 A1 * | 11/2007 | Higashitani ............. 365/185.14 |
| 2008/0049494 A1 * | 2/2008 | Aritome ................... 365/185.02 |
| 2010/0020600 A1 * | 1/2010 | Lee ........................... 365/185.03 |
| 2011/0032757 A1 * | 2/2011 | Dutta et al. .............. 365/185.02 |
| 2012/0120727 A1 * | 5/2012 | Kim et al. ................ 365/185.17 |

* cited by examiner

*Primary Examiner* — Douglas King
(74) *Attorney, Agent, or Firm* — William Park & Associates Patent Ltd.

(57) ABSTRACT

A semiconductor device is operated by, inter alia: programming selected memory cells by applying a first program voltage which is increased by a first step voltage to a selected word line and by applying a first pass voltage having a constant level to unselected word lines, and when a voltage difference between the first program voltage and the first pass voltage reaches a predetermined voltage difference, programming the selected memory cells by applying a second program voltage which is increased by a second step voltage lower than the first step voltage to the selected word line and by applying a second pass voltage which is increased in proportion to the second program voltage to first unselected word lines adjacent to the selected word line among the unselected word lines.

9 Claims, 9 Drawing Sheets

METHOD OF OPERATING SEMICONDUCTOR DEVICE

CROSS-REFERENCE TO RELATED APPLICATION

This application claims priority to and the benefit of Korean patent application numbers 10-2011-0067013 filed on Jul. 6, 2011 and 10-2012-0068544 filed on Jun. 26, 2012, the entire disclosure of which is incorporated herein by reference in its entirety.

BACKGROUND

1. Field of Invention

Various embodiments of the present invention relate generally to a method of operating a semiconductor device and, more particularly, to a program method.

2. Description of Related Art

A semiconductor device includes a memory cell array that stores data therein. The memory cell array consists of a plurality of cell blocks, each of which includes a plurality of cell strings. The cell strings have the same structure as each other, and are described below in more detail.

FIG. 1 is a circuit diagram illustrating a cell string.

With reference to FIG. 1, the cell string includes a drain select transistor, a plurality of memory cells, and a source select transistor that are all coupled in series with one another. A drain select line DSL is coupled to a gate of the drain select transistor, word lines WLn−k to WLn+k are coupled to respective gates of the memory cells, and a source select line SSL is coupled to a gate of the source select transistor. The drain select line DSL is commonly coupled to the other drain select transistors included in each cell string. Similarly, the word lines WLn−k to WLn+k and source select line SSL are each commonly coupled to other memory cells and source select transistors respectively, included in each cell string.

A method of programming a selected memory cell among the plurality of non-selected memory cells included in the aforementioned cell string is described below.

A program voltage Vpgm is applied to a selected word line WLn coupled to a selected memory cell 11, whereas a pass voltage Vpass is applied to unselected word lines WLn−1 to WLn−k and WLn+1 to WLn+k coupled to unselected memory cells. The selected memory cell 11 may be programmed by applying the program voltage Vpgm to the selected word line WLn once. One known method of a program operation, in order to reduce the distribution of threshold voltages of memory cells, has been performed by using the Incremental Step Pulse Program (ISPP) method, in which one of the steps allows for the program voltage Vpgm to gradually increase. Further details of the ISPP method is described below.

FIG. 2 is a graph illustrating a conventional program method.

With reference to FIGS. 1 and 2, a program operation using the ISPP method is performed in such a manner that the program voltage Vpgm is applied to the selected word line WLn and the pass voltage Vpass is applied to the unselected word lines WLn−1 to WLn−k and WLn+1 to WLn+k. In general, pass voltage Vpass is lower than program voltage Vpgm. Specifically, program voltage Vpgm is low at the initial stage of the program operation, and as the program operation is repeatedly performed, program voltage Vpgm is gradually increased. After the program voltage Vpgm and the pass voltage Vpass are applied to the word lines WLn−k to WLn+k, a verify operation is performed to determine whether a threshold voltage of the selected memory cell has reached a predetermined target level. Following the verify operation, the threshold voltage of the selected memory cell is assessed, in which if it has not reached the target level, both the program operation and the verify operation that apply the program voltage Vpgm and the pass voltage Vpass, respectively, are repeated while the program voltage Vpgm is step-increased until the threshold voltage of the selected memory cell reaches the target level. If the threshold voltage has reached the target level, the program operation is complete.

During the program operation, while the program voltage Vpgm gradually increases, the constant pass voltage Vpass(1) applied to the unselected word lines WLn−1 to WLn−k and WLn+1 to WLn+k maintains a constant level. Therefore, the voltage difference between the program voltage Vpgm and the constant pass voltage Vpass(1) gradually increases. During the program operation, an increasing pass voltage Vpass (2) may be applied to the remaining unselected word lines WLn−k to WLn−1 and WLn+1 to WLn+k. The increasing pass voltage Vpass(2) increases by a step-up level lower than that of the program voltage Vpgm.

Particularly, when the program voltage Vpgm applied to the selected word line WLn is above a predetermined level, unselected memory cells 12 adjacent to the selected memory cell 11 may be inadvertently erased. That is, while the program voltage Vpgm gradually increases, if the program voltage Vpgm rises above a critical voltage difference in reference to the pass voltage Vpass, a breakdown between the selected memory cell and the unselected memory cells may occur. Electrons which are stored in the floating gate of the unselected memory cells adjacent to the selected memory cell may be ejected to the control gate of the selected memory cell, thus decreasing the threshold voltages of the unselected memory cells. Additionally, as for unselected memory cells having completed the program operation among the unselected memory cells 12 adjacent to the selected memory cell 11, in the case that threshold voltages of these memory cells decrease, other data may be inadvertently read during a read operation subsequent to the program operation, which may reduce the reliability of the semiconductor device.

In other words, after the program voltage Vpgm being applied to the selected word line WLn gradually increases during the program operation in order for the voltage difference between the program voltage Vpgm and the pass voltage Vpass to reach the critical voltage difference CD, the threshold voltage of the selected memory cell and the threshold voltages of the neighboring memory cells may change, and leakage of the neighboring memory cells may be generated, which may lead to reduction in reliability of the program operation.

BRIEF SUMMARY

Various embodiments relate to preventing unselected memory cells adjacent to a selected memory cell from being erased by not allowing the voltage difference between a program voltage and a pass voltage to exceed a critical voltage difference during a program operation.

Various embodiments relate to avoiding leakage that may occur in a selected memory cell and suppressing interference between adjacent memory cells by reducing the rate of increase of a program voltage after the program voltage being gradually increased reaches a predetermined level.

A method of operating a semiconductor device according to an embodiment of the present invention includes programming selected memory cells by applying a first program voltage which is increased by a first step voltage to a selected word line and by applying a first pass voltage having a constant level to unselected word lines; and when a voltage difference between the first program voltage and the first pass voltage reaches a predetermined voltage difference, programming the selected memory cells by applying a second program voltage which is increased by a second step voltage lower than the first step voltage to the selected word line and by applying a second pass voltage which is increased in proportion to the second program voltage to first unselected word lines adjacent to the selected word line among the unselected word lines.

A method of operating a semiconductor device according to an another embodiment of the present invention includes programming memory cells coupled to the selected word line by applying a first program voltage which is increased by a first step voltage to a selected word line and by applying an eleventh pass voltage which has a lower rate of increase in reference to that of the first program voltage to unselected word lines; and when a voltage difference between the first program voltage and the eleventh pass voltage reaches a predetermined voltage difference, programming the selected memory cells by applying a second program voltage which is increased by a second step voltage lower than the first step voltage to the selected word line and by applying a second pass voltage which is increased in proportion to the second program voltage to first unselected word lines adjacent to the selected word line among the unselected word lines.

DESCRIPTION OF EMBODIMENTS

Hereinafter, various embodiments of the present disclosure will be described in detail with reference to the accompanying drawings. The figures are provided to allow those having ordinary skill in the art to understand the scope of the embodiments of the disclosure.

Figure 1:
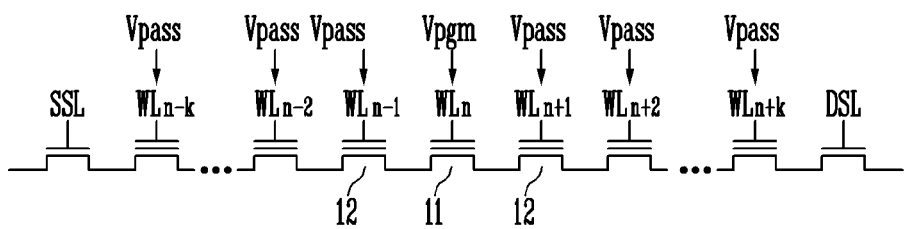
FIG. 1 is a cross-sectional view illustrating a conventional cell string.
Figure 2:
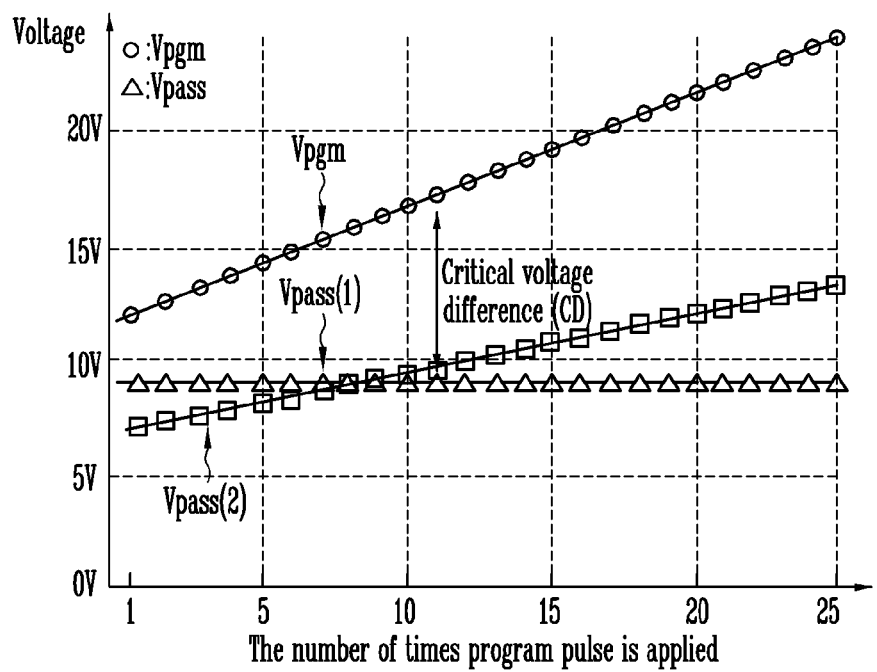
FIG. 2 is a graph illustrating a conventional program method.
Figure 3:
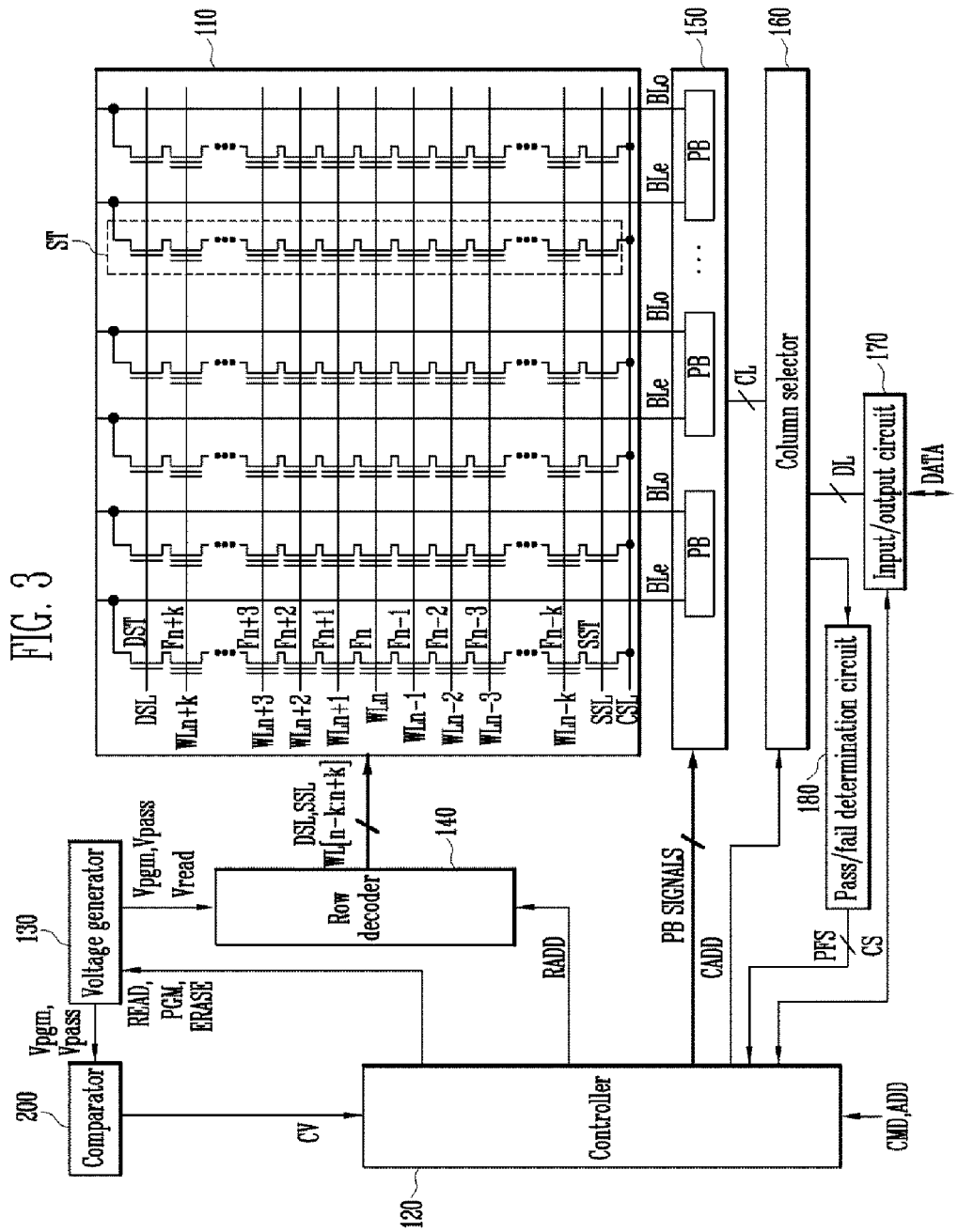
FIG. 3 is a block diagram of a semiconductor device.

FIG. 3 is a block diagram of a semiconductor device.

Referring to FIG. 3, the semiconductor device includes a memory cell array 110, a circuit group (130, 140, 150, 160, 170, 180, and 200) collectively configured to perform a program operation, a read operation, or an erase operation of memory cells included in the memory cell array 110, and a controller 120 configured to control the circuit group (130, 140, 150, 160, 170, 180, and 200) in order to determine threshold voltage levels of selected memory cells in response to input data.

In a NAND flash memory device, the circuit group includes a voltage generator 130, a row decoder 140, a page buffer group 150, a column selector 160, an input/output circuit 170, a pass/fail determination circuit 180, and a comparator 200.

The memory cell array 110 includes a plurality of memory cells coupled to word lines and bit lines. Specifically, the memory cell array 110 includes a plurality of cell blocks. FIG. 3 illustrates one of the plurality of cell blocks. Each of the cell blocks includes a plurality of cell strings ST. Some of the cell strings ST are designated as normal strings, while others are designated as flag strings. The cell strings ST have the same structure as each other. Each of the cell strings ST has a source select transistor SST coupled to a common source line CSL, a plurality of memory cells Fn−k to Fn+k, and a drain select transistor DST coupled to either bit line BLe or BLo. Cells included in a flag string are labeled flag cells, which have the same structure as memory cells. A gate of the source select transistor SST is coupled to a source select line SSL, gates of the memory cells Fn−k to Fn+k are coupled to word lines WLn−k to WLn+k, respectively, and a gate of the drain select transistor DST is coupled to a drain select line DSL. Each cell string ST is coupled to either bit lines BLe or BLo, and the cell strings ST are commonly coupled to the common source line CSL.

Power supply circuits, comprising of the voltage generator 130 and the row decoder 140, apply voltages used to perform a program operation, a read operation, or an erase operation on the memory cells to the drain select line DSL, the word lines WLn−k to WLn+k, the source select line SSL, in response to output signals (PGM, ERASE, READ, and RADD) from the controller 120.

The voltage generator 130 outputs operating pulses used to program, read, or erase the memory cells onto global lines in response to operating signals PGM, READ, and ERASE that are internal command signals of the controller 120. When the memory cells are programmed, the voltage generator 130 outputs the following operating pulses used to perform a program operation onto global lines: a program voltage Vpgm, a pass voltage Vpass, and a read voltage Vread.

The row decoder 140 transfers the operating pulses generated from the voltage generator 130 onto local lines DSL, SSL, and WL[n−k:n+k] of the selected cell block in response to the row address signal RADD of the controller 120.

The comparator 200 compares the program voltage Vpgm and the pass voltage Vpass generated from the voltage generator 130 during the program operation. As a result of the comparison, when a voltage difference between the program voltage Vpgm and the pass voltage Vpass is greater than a predetermined critical voltage difference, the comparator 200 outputs a critical signal CV.

The page buffer group 150 senses a program state or an erase state of each memory cell. The page buffer group 150 includes page buffers PB coupled to the bit lines BLe and BLo, and applies voltages used to store data in the memory cells Fn−k to Fn+k via the bit lines BLe and BLo in response to page buffer output signals PB SIGNALS from the controller 120. Specifically, the page buffer group 150 precharges the bit lines BLe and BLo during a program operation, an erase operation, or a read operation of the memory cells Fn−k to Fn+k, or latches data corresponding to threshold voltage levels of the memory cells Fn−k to Fn+k sensed in response to variations in voltages of the bit lines BLe and BLo. That is, the page buffer group 150 applies a program enable voltage, e.g. a ground voltage, or a program inhibit voltage, e.g. a power voltage, to the bit lines BLe or BLo in response to the data input to latches during the program operation. The page buffer group 150 senses the data stored in the memory cells Fn−k to Fn+k by controlling the voltages of the bit lines BLe and BLo in response to the data stored in the memory cells Fn−k to Fn+k during the read operation. In addition, the page buffer group 150 applies an erase enable voltage, e.g. a power voltage, to the bit lines BLe and BLo at the initial stage of the erase operation and applies a program enable voltage, e.g. a ground voltage, to the bit lines coupled to the cell strings ST erased during the program operation in response to an erase verify result in the middle of the erase operation.

The column selector 160 selects the page buffers PB included in the page buffer group 150 in response to a column address signal output CADD from the controller 120. The latched data of the page buffers PB selected by the column selector 160 are output. In addition, the column selector 160 may receive the data output from the page buffer group 150 via a column line CL or transfer the data to the pass/fail determination circuit 180.

The input/output circuit 170 transfers externally input data DATA to the column selector 160 under control of the controller 120 in order for the data DATA to be an input to the page buffers PB of the page buffer group 150 during the program operation. When the column selector 160 sequentially transfers the data DATA to the page buffers PB of the page buffer group 150, the page buffers PB store the data DATA in internal latches thereof. In addition, the input/output circuit 170 externally outputs the data DATA transferred from the page buffers PB of the page buffer group 150 via the column selector 160 during the read operation.

The pass/fail determination circuit 180 checks whether errors have occurred during a verify operation that is performed after the program operation or the erase operation, and outputs a check result as a check signal PFC. In addition, the pass/fail determination circuit 180 counts the number of cells affected when the errors have occurred, and outputs a counting result as a counting signal CS. The controller 120 controls the program voltage being applied to a selected word line during the program operation of the memory cells. In addition, the controller 120 controls the voltage generator 130 such that verify voltages may be selectively applied to the selected word line during the program verify operation. Here, the controller 120 may control the voltage generator 130 in response to the check signal CS of the pass/fail determination circuit 180.

The controller 120 internally outputs a program operation signal PGM, a read operation signal READ, or an erase operation signal ERASE in response to a command signal CMD, and outputs the page buffer signals PB SIGNALS to control the page buffers PB included in the page buffer group 150 according to the types of operations. In addition, the controller 120 checks whether or not the threshold voltages of the selected memory cells have been raised to the target level in response to the check signal CS output from the pass/fail determination circuit 180 during the program or erase verify operation. As a result, the controller 120 determines whether to repeat or complete the program or erase operation or whether the program or erase operation has failed.

In particular, during the program operation, the controller 120 controls the rising or falling level of the pass voltage Vpass generated by the voltage generator 130 when the critical signal CV is applied. That is, during the program operation, when the voltage difference between the program voltage Vpgm and the pass voltage Vpass generated by the voltage generator 130 reaches the critical voltage difference, the comparator 200 outputs the critical signal CV, and the controller 120 causes the voltage generator 130 to generate the varied pass voltage Vpass in response to the critical signal CV.

A program method using the above-described semiconductor device is described below.

Figure 4:
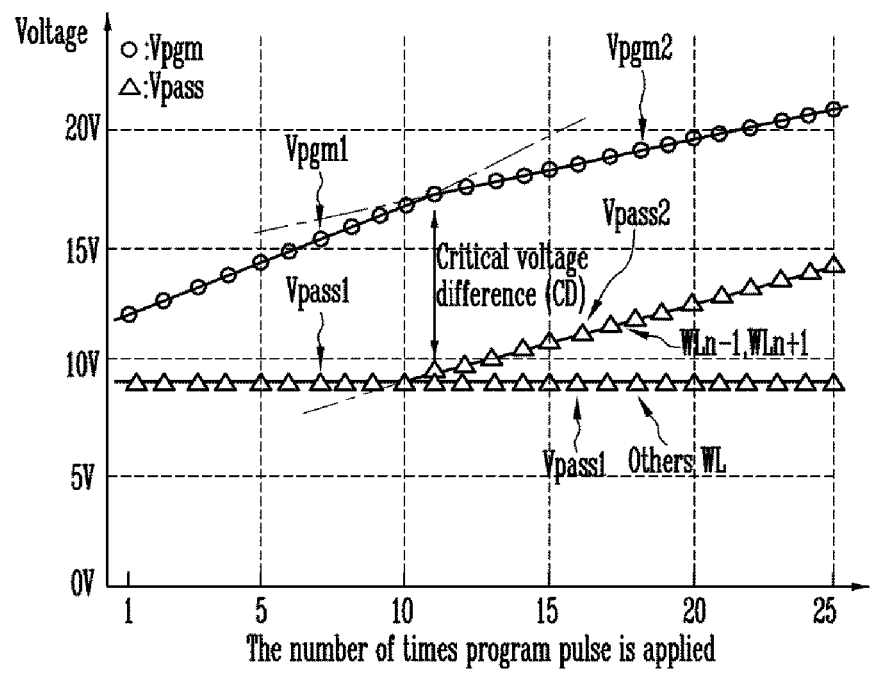
FIG. 4 is a graph illustrating a program method according to a first embodiment of the present invention.

FIG. 4 is a graph illustrating a program method according to a first embodiment of the present invention.

Referring to FIGS. 3 and 4, a program operation is performed by an Incremental Step Pulse Program (ISPP) method where the program voltage Vpgm is gradually increased. During a program operation, a program enable voltage, e.g. a ground voltage, is applied to bit lines coupled to selected cell strings, while a program inhibit voltage, e.g. a power voltage, is applied to bit lines coupled to unselected cell strings. While the program enable voltage or the program inhibit voltage is applied to the bit lines, a first program voltage Vpgm1 that is increased if necessary by a first step voltage is applied to the selected word line WLn, whereas the pass voltage is applied to unselected word lines WLn−1 to WLn−k and WLn+1 to WLn+k.

At the initial stage of the program operation using the ISPP method, the voltage difference between the first program voltage Vpgm1 and a first pass voltage Vpass1 is smaller than the critical voltage difference CD, the first program voltage Vpgm1 being increased if necessary by the first step voltage is applied to the selected word line WLn coupled to the selected memory cell Fn, while the constant first pass voltage Vpass1 is applied to the unselected word lines WLn−1 to WLn−k and WLn+1 to WLn+k. The critical voltage difference CD refers to the maximum voltage difference that does not cause first unselected memory cells Fn−1 and Fn+1 most adjacent to the selected memory cell Fn to be erased due to the first program voltage Vpgm1 when the selected memory cell Fn is programmed. Since the critical voltage difference CD may differ between semiconductor devices, the critical voltage difference CD may be calculated by testing the semiconductor device. In this embodiment of the present invention, a description will be made to a case in which the critical voltage difference CD is 7.5 V.

When the first program voltage Vpgm1 applied to the selected word line WLn is 12 V and the first pass voltage Vpass1 is 9 V, a voltage difference between the first program voltage Vpgm1 and the first pass voltage Vpass1 is 3 V, which is lower than the critical voltage difference CD. Since the first unselected memory cells Fn−1 and Fn+1 most adjacent to the selected memory cell Fn are not affected by the first program voltage Vpgm1, the first pass voltage Vpass1 is applied to the entirety of the unselected word lines WLn−1 to WLn−k and WLn+1 to WLn+k. When the threshold voltages of the selected memory cell Fn have not reached the target voltage, the first program voltage Vpgm1 is increased by a step voltage in proportion to the number of times the first program voltage Vpgm1 is applied until the voltage difference between the first program voltage Vpgm1 and the first pass voltage Vpass1 reaches the critical voltage difference CD, where a constant first pass voltage Vpass1 is maintained.

As the program operation is being performed by applying the first program voltage Vpgm1 with a corresponding first step voltage increase to the selected word line WLn, if the voltage difference between the first program voltage Vpgm1 and the first pass voltage Vpass1 reaches the critical voltage difference CD, the program operation continues to be performed by applying a second program voltage Vpgm2 with a corresponding second step voltage increase lower than the first step voltage increase. That is, when the voltage difference between the first program voltage Vpgm1 and the first pass voltage Vpass1 reaches the critical voltage difference CD, the rate of increase of the program voltage is lowered to perform the program operation. For example, when the first step voltage increase is 0.5 V, the second step voltage increase is set to be within a range between 0 V to 0.5 V.

When the second program voltage Vpgm2 having a rate of increase lower than that of the first program voltage Vpgm1 is applied to the selected word line WLn, a second pass voltage Vpass2 that is gradually increased is applied to the first unselected word lines WLn−1 and WLn+1 most adjacent to both ends of the selected word line WLn to fix the CD between the selected word line WLn and the first unselected word lines WLn−1 and WLn+1. When the second pass voltage Vpass2 being gradually increased is applied to the first unselected word lines WLn−1 and WLn+1, a step voltage increase of the second pass voltage Vpass2 may be substantially the same as the step voltage increase of the second program voltage Vpgm2. For example, when the step voltage increase of the second program voltage Vpgm2 is 0.3 V, the second pass voltage Vpass2 is also increased by 0.3 V.

At this point, a constant first pass voltage Vpass1 is applied to the other unselected word lines WLn−2 to WLn−k and WLn+2 to WLn+k except for the first unselected word lines WLn−1 and WLn+1.

By lowering the rate of increase of the program voltage applied to the selected word line WLn, an excessive increase in the program voltage may be avoided, and the generation of leakage current caused by a breakdown which may be cured between the selected memory cell and the unselected memory cells may consequently be reduced. In addition, while the program operation is being performed by using the program voltage with a lower rate of increase, the pass voltage applied to the first unselected word lines WLn−1 and WLn+1 most adjacent to the selected word line WLn are gradually raised, thereby suppressing the deterioration in program efficiency of the selected memory cells and the decrease of the threshold voltage of the unselected memory cells.

Figure 5:
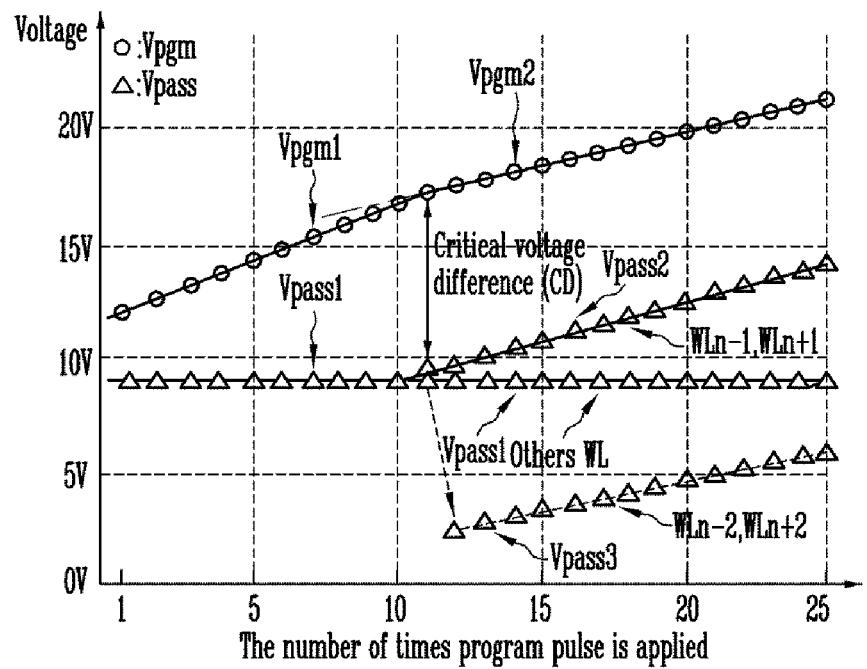
FIG. 5 is a graph illustrating a program method according to a second embodiment of the present invention.

FIG. 5 is a graph illustrating a program method according to a second embodiment of the present invention.

Referring to FIGS. 3 and 5, a program operation is performed by an Incremental Step Pulse Program (ISPP) method where a program voltage is gradually increased. During a program operation, a program enable voltage, e.g. a ground voltage, is applied to bit lines coupled to selected cell strings, while a program inhibit voltage, e.g. a power voltage, is applied to bit lines coupled to unselected cell strings. While the program enable voltage or the program inhibit voltage is applied to the bit lines, the first program voltage Vpgm1 that is increased if necessary by a first step voltage is applied to the selected word line WLn, whereas the pass voltage is applied to the unselected word lines WLn−1 to WLn−k and WLn+1 to WLn+k.

At the initial stage of the program operation, the voltage difference between the first program voltage Vpgm1 and the first pass voltage Vpass1 is smaller than the critical voltage difference CD, the first program voltage Vpgm1 being increased if necessary by the first step voltage is applied to the selected word line WLn coupled to the selected memory cells Fn, while the constant first pass voltage Vpass1 is applied to the unselected word lines WLn−1 to WLn−k and WLn+1 to WLn+k. The critical voltage difference CD refers to the maximum voltage difference that does not cause the first unselected memory cells Fn−1 and Fn+1 most adjacent to the selected memory cell Fn to be erased due to the first program voltage Vpgm1 when the selected memory cell Fn is programmed. Since the critical voltage difference CD may differ between semiconductor devices, the critical voltage difference CD may be calculated by testing the semiconductor device. In this embodiment of the present invention, a description will be made to a case in which the critical voltage difference CD is 7.5 V.

When the first program voltage Vpgm1 applied to the selected word line WLn is 12 V and the first pass voltage Vpass1 is 9 V, the voltage difference between the first program voltage Vpgm1 and the first pass voltage Vpass1 is 3 V, which is lower than the critical voltage difference CD. Since the first unselected memory cells Fn−1 and Fn+1 most adjacent to the selected memory cell Fn are not affected by the first program voltage Vpgm1, the first pass voltage Vpass1 is applied to the entirety of the unselected word lines WLn−1 to WLn−k and WLn+1 to WLn+k. When the threshold voltages of the selected memory cell Fn have not reached the target voltage, the first program voltage Vpgm1 is increased by a step voltage in proportion to the number of times the first program voltage Vpgm1 is applied until the voltage difference between the first program voltage Vpgm1 and the first pass voltage Vpass1 reaches the critical voltage difference CD, where a constant first pass voltage Vpass1 is maintained.

As the program operation is being performed by applying the first program voltage Vpgm1 with a corresponding first step voltage increase to the selected word line WLn, if the voltage difference between the first program voltage Vpgm1 and the first pass voltage Vpass1 reaches the critical voltage difference CD, the program operation continues to be performed by applying the second program voltage Vpgm2 with a corresponding second step voltage increase lower than the first step voltage increase. That is, after the voltage difference between the first program voltage Vpgm1 and the first pass voltage Vpass1 reaches the critical voltage difference CD, the rate of increase of the program voltage is lowered to perform the program operation. For example, when the first step voltage increase is 0.5 V, the second step voltage increase is set to be within a range between 0 V to 0.5 V.

When the second program voltage Vpgm2 having a rate of increase lower than that of the first program voltage Vpgm1 is applied to the selected word line WLn, the second pass voltage Vpass1 being gradually increased is applied to the first unselected word lines WLn−1 and WLn+1 most adjacent to both ends of the selected word line WLn to fix the CD between the selected word line WLn and the first unselected word lines WLn−1 and WLn+1. When the second pass voltage Vpass2 is applied to the selected word line WLn, if the second pass voltage Vpass2 being gradually increased is applied to the first unselected word lines WLn−1 and WLn+1, the potentials of the selected memory cells may be increased by the second pass voltage Vpass2 due to coupling for example, thereby suppressing the reduction in efficiency of the program operation caused by the second program voltage Vpgm2 having the lowered rate of increase. Preferably, the step voltage increase of the second pass voltage Vpass2 may be substantially the same as the step voltage increase of the second program voltage Vpgm2. For example, when the step voltage increase of the second program voltage Vpgm2 is 0.3 V, the second pass voltage Vpass2 is also increased by 0.3 V.

While the second pass voltage Vpass2 being gradually increased is being applied to the first unselected word lines WLn−1 and WLn+1, the threshold voltages of the first unselected memory cells Fn−1 and Fn+1 coupled to the first unselected word lines WLn−1 and WLn+1, respectively, and the second unselected memory cells Fn−2 and Fn+2 adjacent to the first unselected memory cells Fn−1 and Fn+1, respectively, may decrease. In order to suppress the decrease in threshold voltage thereof, a third pass voltage Vpass3 that is lower than the first pass voltage Vpass1 by the critical voltage difference CD is applied to the second unselected word lines WLn−2 and WLn+2 adjacent to the first unselected word lines WLn−1 and WLn+1, respectively. At this point, the first pass voltage Vpass1 continues to be applied to the other unselected word lines WLn−3 to WLn−k and WLn+3 to WLn+k except for the first unselected word lines WLn−1 and WLn+1 and the second unselected word lines WLn−2 and WLn+2.

In other words, in order to avoid the decrease in threshold voltage of each of the first and second unselected memory cells Fn−1, Fn−2, Fn+1, and Fn+2 caused by the second pass voltage Vpass2 being gradually increased, the level of the first pass voltage Vpass1 applied to the second unselected word lines WLn−2 and WLn+2 coupled to the second unselected memory cells Fn−2 and Fn+2, respectively, is lowered by the critical voltage difference CD, and the third pass voltage Vpass3 being gradually increased is subsequently applied thereto. For example, when the step voltage increase of the second program voltage Vpgm2 is 0.3 V, the second pass voltage Vpass2 and the third pass voltage Vpass3 are also increased by 0.3 V.

By lowering the rate of increase of the program voltage applied to the selected word line WLn, an excessive increase in the program voltage may be avoided, and the generation of leakage current caused by a breakdown voltage may consequently be suppressed. In addition, while the program operation is being performed, the pass voltage applied to the first unselected word lines WLn−1 and WLn+1 most adjacent to the selected word line WLn is gradually increased to thereby compensate for a reduction of program efficiency of the selected memory cells. By applying the third pass voltage Vpass3 lower than the second pass voltage Vpass2 by the critical voltage difference CD to the second unselected word lines WLn−2 and WLn+2, the decrease in threshold voltage of each of the first and second unselected memory cells Fn−1, Fn−2, Fn+1, and Fn+2 may be avoided.

Figure 6:
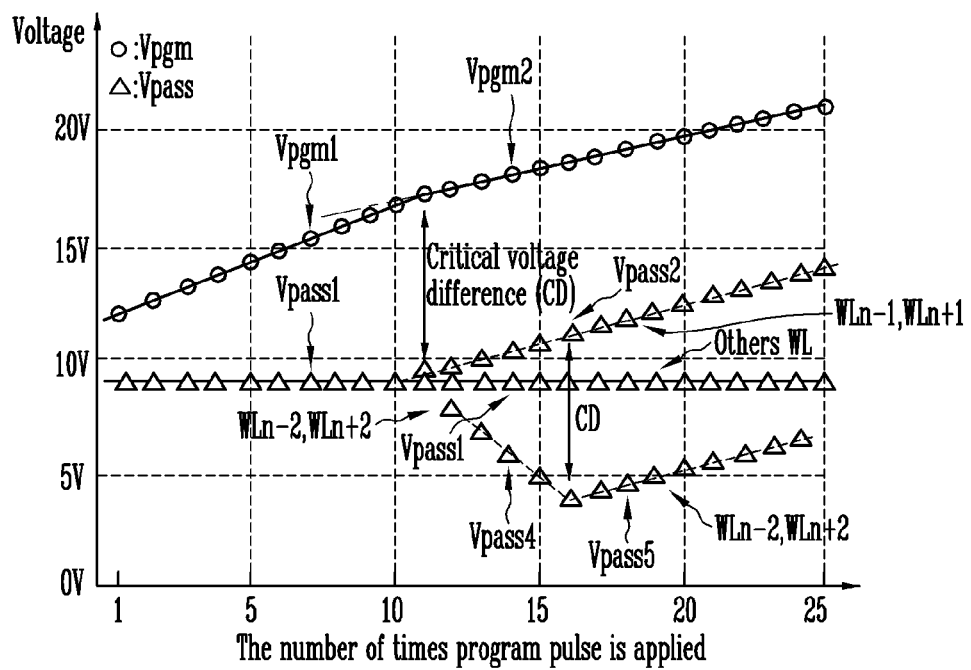
FIG. 6 is a graph illustrating a program method according to a third embodiment of the present invention.

FIG. 6 is a graph illustrating a program method according to a third embodiment of the present invention.

Referring to FIGS. 3 and 6, a program operation is performed by an Incremental Step Pulse Program (ISPP) method where a program voltage is gradually increased. During a program operation, a program enable voltage, e.g. a ground voltage, is applied to bit lines coupled to selected cell strings, while a program inhibit voltage, e.g. a power voltage, is applied to bit lines coupled to unselected cell strings. While the program enable voltage or the program inhibit voltage is applied to the bit lines, the first program voltage Vpgm1 being gradually increased is applied to the selected word line WLn, whereas the pass voltage is applied to the unselected word lines WLn−1 to WLn−k and WLn+1 to WLn+k.

At the initial stage of the program operation, the voltage difference between the first program voltage Vpgm1 and the first pass voltage Vpass1 is smaller than the critical voltage difference CD, the first program voltage Vpgm1 being increased if necessary by the first step voltage is applied to the selected word line WLn coupled to the selected memory cells Fn, while the constant first pass voltage Vpass1 is applied to the unselected word lines WLn−1 to WLn−k and WLn+1 to WLn+k. The critical voltage difference CD refers to the maximum voltage difference that does not cause the first unselected memory cells Fn−1 and Fn+1 most adjacent to the selected memory cell Fn to be erased due to the first program voltage Vpgm1 when the selected memory cell Fn is programmed. Since the critical voltage difference CD may differ between semiconductor devices, the critical voltage difference CD may be calculated by testing the semiconductor device. In this embodiment of the present invention, a description will be made to a case in which the critical voltage difference CD is 7.5 V.

When the first program voltage Vpgm1 applied to the selected word line WLn is 12 V and the first pass voltage Vpass1 is 9 V, the voltage difference between the first program voltage Vpgm1 and the first pass voltage Vpass1 is 3 V, which is lower than the critical voltage difference CD. Since the first unselected memory cells Fn−1 and Fn+1 most adjacent to the selected memory cell Fn are not affected by the first program voltage Vpgm1, the first pass voltage Vpass1 is applied to the entirety of the unselected word lines WLn−1 to WLn−k and WLn+1 to WLn+k. When the threshold voltages of the selected memory cell Fn have not reached the target voltage, the first program voltage Vpgm1 is increased by a step voltage in proportion to the number of times the first program voltage Vpgm1 is applied until the voltage difference between the first program voltage Vpgm1 and the first pass voltage Vpass1 reaches the critical voltage difference CD, where a constant first pass voltage Vpass1 is maintained.

As the program operation is being performed by applying the first program voltage Vpgm1 to the selected word line WLn, if the voltage difference between the first program voltage Vpgm1 and the first pass voltage Vpass1 reaches the critical voltage difference CD, the program operation continues to be performed by applying the second program voltage Vpgm2 with a corresponding second step voltage increase lower than the first step voltage increase. For example, when the first step voltage increase is 0.5 V, the second step voltage increase is set to be within a range between 0 V to 0.5 V.

When the second program voltage Vpgm2 having a rate of increase lower than that of the first program voltage Vpgm1 is applied to the selected word line WLn, the second pass voltage Vpass2 being gradually increased is applied to the first unselected word lines WLn−1 and WLn+1 most adjacent to both ends of the selected word line WLn. When the second program voltage Vpgm2 is applied to the selected word line WLn, if the second pass voltage Vpass2 being gradually increased is applied to the first unselected word lines WLn−1 and WLn+1, the potentials of the selected memory cells may be increased by the second pass voltage Vpass2, thereby suppressing the reduction in efficiency of the program operation caused by the second program voltage Vpgm2. Preferably, the step voltage increase of the second pass voltage Vpass2 may be substantially the same as the step voltage increase of the second program voltage Vpgm2. For example, when the step voltage increase of the second program voltage Vpgm2 is 0.3 V, the second pass voltage Vpass2 is also increased by 0.3 V.

While the second pass voltage Vpass2 being gradually increased is applied to the first unselected word lines WLn−1 and WLn+1, a fourth pass voltage Vpass4 that is gradually decreased is applied to the second unselected word lines WLn−2 and WLn+2 adjacent to the first unselected word lines WLn−1 and WLn+1, respectively. The first pass voltage Vpass1 continues to be applied to the other unselected word lines WLn−3 to WLn−k and WLn+3 to WLn+k except for the first unselected word lines WLn−1 and WLn+1 most adjacent to the selected word line WLn and the next adjacent second unselected word lines WLn−2 and WLn+2.

The fourth pass voltage Vpass4 is applied to the second unselected memory cells Fn−2 and Fn+2 adjacent to the first unselected memory cells Fn−1 and Fn+1, respectively. In order to avoid a decrease in threshold voltage of each of the first and second unselected memory cells Fn−1, Fn−2, Fn+1, and Fn+2 caused by the second pass voltage Vpass2, the fourth pass voltage Vpass4 that is decreased by a step voltage decrease is applied to the second unselected word lines WLn−2 and WLn+2 coupled to the second unselected memory cells Fn−2 and Fn+2. As for the fourth pass voltage Vpass4 specifically, when a coupling ratio by the word line coupled to the selected memory cell is 0.6 and a coupling ratio by the word line coupled to the neighboring memory cell is 0.15, the maximum step voltage decrease of the fourth pass voltage Vpass4 is 0.5V×(0.6/0.15)=2V. Therefore, preferably, the step voltage decrease of the fourth pass voltage Vpass4 may fall within a range between 0 V and 2 V.

Since the second pass voltage Vpass2 is increased by the step voltage increase, and the fourth pass voltage Vpass4 is decreased by the step voltage decrease, the voltage difference between the second pass voltage Vpass2 and the fourth pass voltage Vpass4 may reach the critical voltage difference CD before the program operation is completed. When the voltage difference between the second pass voltage Vpass2 and the fourth pass voltage Vpass4 reaches the critical voltage difference CD, a fifth pass voltage Vpass5 that is gradually increased is applied to the same second unselected word lines WLn−2 and WLn+2 to which the fourth pass voltage Vpass4 was applied. Without Vpass5, the voltage difference between the second pass voltage Vpass2 and the fourth pass voltage Vpass4 grows far greater than the critical voltage difference CD, with the threshold voltages of the first unselected memory cells Fn−1 and Fn+1 continuing to decrease due to the second pass voltage Vpass2 continuing to increase. In order to suppress the increase in the threshold voltages thereof, the fifth pass voltage Vpass5 that is increased by the step voltage increase is applied to the second unselected word lines WLn−2 and WLn+2. Even when the second or fifth pass voltages Vpass2 or Vpass5 are applied to the first and second unselected word lines WLn−1, WLn−2, WLn+1, and WLn+2, the constant first pass voltage Vpass1 continues to be applied to the other unselected word lines WLn−3 to WLn−k and WLn+3 to WLn+k.

By lowering the rate of increase of the program voltage applied to the selected word line WLn, an excessive increase in the program voltage may be avoided, and the generation of leakage current caused by a breakdown voltage may consequently be suppressed. In addition, while the program operation is being performed by applying the constant program voltage, the pass voltage applied to the first unselected word lines WLn−1 and WLn+1 most adjacent to the selected word line WLn is gradually increased to thereby avoid a reduction in program efficiency of the selected memory cells. In addition, by controlling the pass voltage applied to second and third unselected word lines WLn−2, WLn−3, WLn+2, and WLn+3, changes in threshold voltages of the first to third unselected memory cells Fn−1 to Fn−3 and Fn+1 to Fn+3 caused by the second pass voltage Vpass2 applied to the first unselected word lines WLn−1 and WLn+1 may be reduced.

Figure 7:
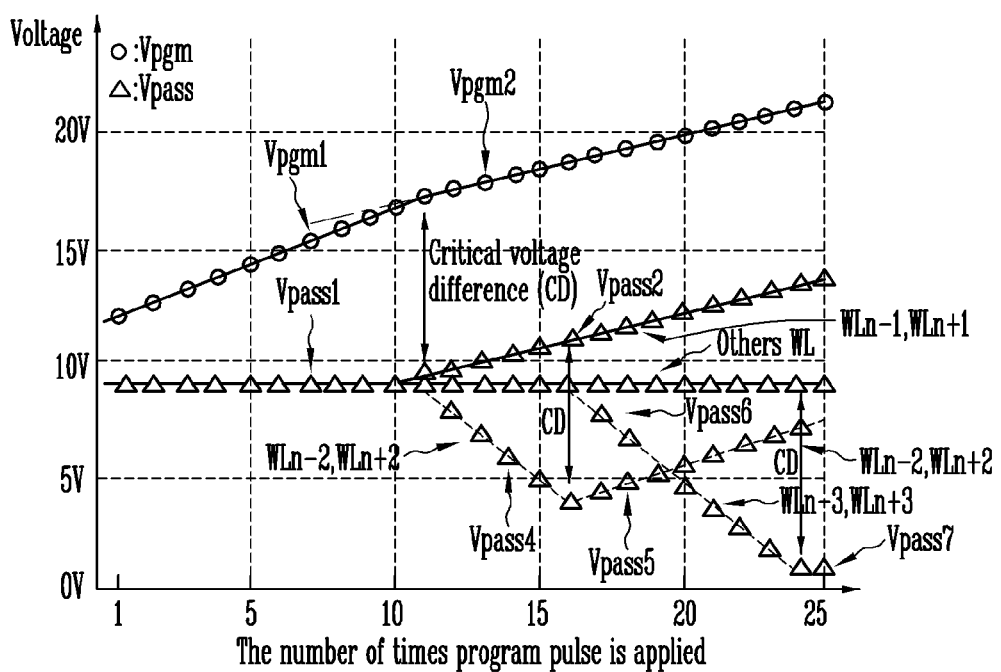
FIG. 7 is a graph illustrating a program method according to a fourth embodiment of the present invention.

FIG. 7 is a graph illustrating a program method according to a fourth embodiment of the present invention.

Referring to FIGS. 3 and 7, a program operation is performed by an Incremental Step Pulse Program (ISPP) method where a program voltage is gradually increased. During a program operation, a program enable voltage, e.g. a ground voltage, is applied to bit lines coupled to selected cell strings, while a program inhibit voltage, e.g. a power voltage, is applied to bit lines coupled to unselected cell strings. While the program enable voltage or the program inhibit voltage is applied to the bit lines, the first program voltage Vpgm1 being gradually increased is applied to the selected word line WLn, whereas the pass voltage is applied to the unselected word lines WLn−1 to WLn−k and WLn+1 to WLn+k.

At the initial stage of the program operation, the voltage difference between the first program voltage Vpgm1 and the first pass voltage Vpass1 is smaller than the critical voltage difference CD, the first program voltage Vpgm1 being increased if necessary by the first step voltage is applied to the selected word line WLn coupled to the selected memory cells Fn, while the constant first pass voltage Vpass1 is applied to the unselected word lines WLn−1 to WLn−k and WLn+1 to WLn+k. The critical voltage difference CD refers to the maximum voltage difference that does not cause the first unselected memory cells Fn−1 and Fn+1 most adjacent to the selected memory cell Fn to be programmed due to the first program voltage Vpgm1 when the selected memory cell Fn is programmed. Since the critical voltage difference CD may differ between semiconductor devices, the critical voltage difference CD may be calculated by testing the semiconductor device. In this embodiment of the present invention, a description will be made to a case in which the critical voltage difference CD is 7.5 V.

When the first program voltage Vpgm1 applied to the selected word line WLn is 12 V and the first pass voltage Vpass1 is 9 V, the voltage difference between the first program voltage Vpgm1 and the first pass voltage Vpass1 is 3 V, which is lower than the critical voltage difference CD. Since the first unselected memory cells Fn−1 and Fn+1 most adjacent to the selected memory cell Fn are hardly affected by the first program voltage Vpgm1, the first pass voltage Vpass1 is applied to the entirety of the unselected word lines WLn−1 to WLn−k and WLn+1 to WLn+k. When the threshold voltages of the selected memory cell Fn have not reached the target voltage, the first program voltage Vpgm1 is increased by step voltage in proportion to the number of times the first program voltage Vpgm1 is applied until the voltage difference between the first program voltage Vpgm1 and the first pass voltage Vpass1 reaches the critical voltage difference CD, where a constant first pass voltage Vpass1 is maintained.

As the program operation is being performed by applying the first program voltage Vpgm1 to the selected word line WLn, if the voltage difference between the first program voltage Vpgm1 and the first pass voltage Vpass1 reaches the critical voltage difference CD, the program operation continues to be performed by applying the second program voltage Vpgm2 with a corresponding second step voltage increase lower than the first step voltage increase.

When the second program voltage Vpgm2 having a rate of increase lower than that of the first program voltage Vpgm1 is applied to the selected word line WLn, the second pass voltage Vpass2 being gradually increased is applied to the first unselected word lines WLn−1 and WLn+1 most adjacent to both ends of the selected word line WLn. When the second program voltage Vpgm2 is applied to the selected word line WLn, if the second pass voltage Vpass2 being gradually increased is applied to the first unselected word lines WLn−1 and WLn+1, a decrease of the threshold voltages of the memory cells coupled to the first unselected word lines WLn−1 and WLn+1 may be prevented. Preferably, the step voltage increase of the second pass voltage Vpass2 may be substantially the same as the step voltage increase of the second program voltage Vpgm2. For example, when the step voltage increase of the second program voltage Vpgm2 is 0.3 V, the second pass voltage Vpass2 is also increased by 0.3 V.

While the second pass voltage Vpass2 being gradually increased is applied to the first unselected word lines WLn−1 and WLn+1, the fourth pass voltage Vpass4 that is gradually decreased is applied to the second unselected word lines WLn−2 and WLn+2 adjacent to the first unselected word lines WLn−1 and WLn+1, respectively. At this point, the first pass voltage Vpass1 continues to be applied to the other unselected word lines WLn−3 to WLn−k and WLn+3 to WLn+k except for the first unselected word lines WLn−1 and WLn+1 most adjacent to the selected word line WLn and the next adjacent second unselected word lines WLn−2 and WLn+2.

The fourth pass voltage Vpass4 is applied to the second unselected memory cells Fn−2 and Fn+2 adjacent to the first unselected memory cells Fn−1 and Fn+1, respectively. In order to avoid the decrease in threshold voltage of each of the first and second unselected memory cells Fn−1, Fn−2, Fn+1, and Fn+2 caused by the second pass voltage Vpass2, the fourth pass voltage Vpass4 that is decreased by a step voltage decrease is applied to the second unselected word lines WLn−2 and WLn+2 coupled to the second unselected memory cells Fn−2 and Fn+2, respectively. As for the fourth pass voltage Vpass4 specifically, when a coupling ratio by the word line coupled to the selected memory cell is 0.6 and a coupling ratio by the word line coupled to the neighboring memory cell is 0.15, the maximum step voltage decrease of the fourth pass voltage Vpass4 is $0.5V \times (0.6/0.15) = 2V$. Therefore, preferably, the step voltage decrease of the fourth pass voltage Vpass4 may fall within a range between 0 V and 2 V.

Since the second pass voltage Vpass2 is gradually raised, and the fourth pass voltage Vpass4 is gradually lowered, the voltage difference between the second pass voltage Vpass2 and the fourth pass voltage Vpass4 may reach the critical voltage difference CD before the program operation is completed. After the voltage difference between the second pass voltage Vpass2 and the fourth pass voltage Vpass4 has reached the critical voltage difference CD, the fifth pass voltage Vpass5 that is gradually increased is applied to the same second unselected word lines WLn−2 and WLn+2 to which the fourth pass voltage Vpass4 was applied, whereas a sixth pass voltage Vpass6 that is gradually decreased is applied to the third unselected word lines WLn−3 and WLn+3 adjacent to the second unselected word lines WLn−2 and WLn+2. Without Vpass5, the voltage difference between the second pass voltage Vpass2 and the fourth pass voltage Vpass4 grows far greater than the critical voltage difference CD, with the threshold voltages of the first unselected memory cells Fn−1 and Fn+1 continuing to decrease due to the second pass voltage Vpass2 continuing to increase. In order to avoid the decrease in threshold voltage thereof, the fifth pass voltage Vpass5 that is gradually increased is applied to the second unselected word lines WLn−2 and WLn+2. When the second, fifth, or sixth pass voltages Vpass2, Vpass5, or Vpass6 are applied to the first to third unselected word lines WLn−1 to WLn−3 and WLn+1 to WLn+3 sequentially adjacent to the selected word line WLn, the constant first pass voltage Vpass1 continues to be applied to the other unselected word lines WLn−4 to WLn−k and WLn+4 to WLn+k.

While the sixth pass voltage Vpass6 being gradually decreased is applied to the third unselected word lines WLn−3 and WLn+3, a voltage difference between the sixth pass voltage Vpass6 and the first pass voltage Vpass1 may reach the critical voltage difference CD. After the voltage difference therebetween has reached the critical voltage difference CD, in order to suppress a further increase in the voltage difference between the third unselected word lines WLn−3 and WLn+3 and fourth word lines WLn−4 and WLn+4, a constant seventh pass voltage Vpass7 is applied to the third unselected word lines WLn−3 and WLn+3 having potentials lowered by the sixth pass voltage Vpass6.

By lowering the rate of increase of the program voltage applied to the selected word line WLn, an excessive increase in the program voltage may be avoided, and the generation of leakage current may consequently be suppressed. In addition, by controlling the pass voltages applied to the first to third unselected word lines WLn−1 to WLn−3 and WLn+1 to WLn+3 adjacent to the selected word line WLn, changes in threshold voltages of the first to third memory cells Fn−1 to Fn−3 and Fn+1 to Fn+3 adjacent to the selected memory cell Fn may be reduced.

Figure 8:
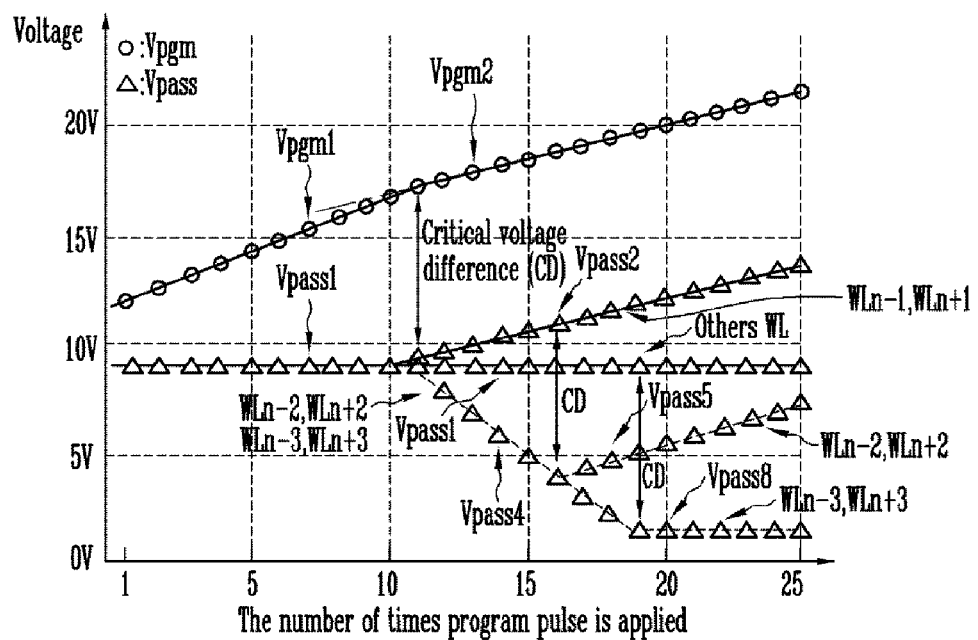
FIG. 8 is a graph illustrating a program method according to a fifth embodiment of the present invention.

FIG. 8 is a graph illustrating a program method according to a fifth embodiment of the present invention.

Referring to FIGS. 3 and 8, a program operation is performed by an Incremental Step Pulse Program (ISPP) method where a program voltage is gradually increased. During a program operation, a program enable voltage, e.g. a ground voltage, is applied to bit lines coupled to selected cell strings, while a program inhibit voltage, e.g. a power voltage, is applied to bit lines coupled to unselected cell strings. While the program enable voltage or the program inhibit voltage is applied to the bit lines, the first program voltage Vpgm1 being gradually increased is applied to the selected word line WLn, whereas the pass voltage is applied to the unselected word lines WLn−1 to WLn−k and WLn+1 to WLn+k.

At the initial stage of the program operation, the voltage difference between the first program voltage Vpgm1 and the first pass voltage Vpass1 is smaller than the critical voltage difference CD, the first program voltage Vpgm1 being increased if necessary by the first step voltage is applied to the selected word line WLn coupled to the selected memory cells Fn, while the constant first pass voltage Vpass1 is applied to the unselected word lines WLn−1 to WLn−k and WLn+1 to WLn+k. The critical voltage difference CD refers to the maximum voltage difference that does not cause the first unselected memory cells Fn−1 and Fn+1 most adjacent to the selected memory cell Fn to be erased due to the first program voltage Vpgm1 when the selected memory cell Fn is programmed. Since the critical voltage difference CD may differ between semiconductor devices, the critical voltage difference CD may be calculated by testing the semiconductor device. In this embodiment of the present invention, a description will be made to a case in which the critical voltage difference CD is 7.5 V.

When the first program voltage Vpgm1 applied to the selected word line WLn is 12 V and the first pass voltage Vpass1 is 9 V, the voltage difference between the first program voltage Vpgm1 and the first pass voltage Vpass1 is 3 V, which is lower than the critical voltage difference CD. Since the first unselected memory cells Fn−1 and Fn+1 most adjacent to the selected memory cell Fn are hardly affected by the first program voltage Vpgm1, the first pass voltage Vpass1 is applied to the entirety of the unselected word lines WLn−1 to WLn−k and WLn+1 to WLn+k. When the threshold voltages of the selected memory cell Fn have not reached the target voltage, the first program voltage Vpgm1 is increased by the step voltage in proportion to the number of times the first program voltage Vpgm1 is applied until the voltage difference between the first program voltage Vpgm1 and the first pass voltage Vpass1 reaches the critical voltage difference CD, where a constant first pass voltage Vpass1 is maintained.

As the program operation is performed by applying the first program voltage Vpgm1 to the selected word line WLn, if the voltage difference between the first program voltage Vpgm1 and the first pass voltage Vpass1 reaches the critical voltage difference CD, the program operation continues to be performed by applying the second program voltage Vpgm2 with a corresponding second step voltage lower than the first step voltage increase.

When the program operation is performed by applying the second program voltage Vpgm2 having a rate of increase lower than that of the first program voltage Vpgm1 to the selected word line WLn, the second pass voltage Vpass2 being gradually increased is applied to the first unselected word lines WLn−1 and WLn+1 most adjacent to both ends of the selected word line WLn. When the second program voltage Vpgm2 is applied to the selected word line WLn, if the second pass voltage Vpass2 being gradually increased is applied to the first unselected word lines WLn−1 and WLn+1, the potentials of the selected memory cells may be increased by the second pass voltage Vpass2, thereby suppressing the reduction in efficiency of the program operation caused by the second program voltage Vpgm2. Preferably, the step voltage increase of the second pass voltage Vpass2 may be substantially the same as the step voltage increase of the second program voltage Vpgm2. For example, when the second step level is 0.3 V, the second pass voltage Vpass2 is also increased by 0.3 V.

While the second pass voltage Vpass2 being gradually increased is applied to the first unselected word lines WLn−1 and WLn+1, the fourth pass voltage Vpass4 being gradually decreased is applied to the second unselected word lines WLn−2 and WLn+2 adjacent to the first unselected word lines WLn−1 and WLn+1. The constant first pass voltage Vpass1 continues to be applied to the other unselected word lines WLn−3 to WLn−k and WLn+3 to WLn+k except for the first unselected word lines WLn−1 and WLn+1 most adjacent to the selected word line WLn and the next adjacent second unselected word lines WLn−2 and WLn+2.

The fourth pass voltage Vpass4 is applied to the second unselected memory cells Fn−2 and Fn+2 adjacent to the first unselected memory cells Fn−1 and Fn+1, respectively. In order to avoid a decrease in threshold voltage of each of the first and second unselected memory cells Fn−1, Fn−2, Fn+1, and Fn+2 caused by the second pass voltage Vpass2, the fourth pass voltage Vpass4 being decreased by a step voltage decrease is applied to the second unselected word lines WLn−2 and WLn+2 coupled to the second unselected memory cells Fn−2 and Fn+2, respectively. As for the fourth pass voltage Vpass4 specifically, when a coupling ratio by the word line coupled to the selected memory cell is 0.6 and a coupling ratio by the word line coupled to the neighboring memory cell is 0.15, the maximum step voltage decrease of the fourth pass voltage Vpass4 is 0.5V×(0.6/0.15)=2V. Therefore, preferably, the step voltage decrease of the fourth pass voltage Vpass4 may fall within a range between 0 V and 2 V.

Since the second pass voltage Vpass2 is gradually raised, and the fourth pass voltage Vpass4 is gradually lowered, the voltage difference between the second pass voltage Vpass2 and the fourth pass voltage Vpass4 may reach the critical voltage difference CD before the program operation is completed. After the voltage difference therebetween has reached the critical voltage difference CD, the fifth pass voltage Vpass5 that is gradually increased is applied to the same second unselected word lines WLn−2 and WLn+2 to which the fourth pass voltage Vpass4 was applied, whereas the fourth pass voltage Vpass4 being gradually decreased continues to be applied to the third unselected word lines WLn−3 and WLn+3. Since the second unselected memory cells Fn−2 and Fn+2 are more affected by the second pass voltage Vpass2 applied to the first unselected word lines WLn−1 and WLn+1 than the third unselected memory cells Fn−3 and Fn+3, the influence of the second pass voltage Vpass2 is compensated by increasing the potentials of the second unselected word lines WLn−2 and WLn+2 coupled to the second unselected memory cells Fn−2 and Fn+2, respectively. At this point, the constant first pass voltage Vpass1 continues to be applied to the other unselected word lines WLn−4 to WLn−k and WLn+4 to WLn+k.

When the voltage difference between the fourth pass voltage Vpass4 and the first pass voltage Vpass1 reaches the critical voltage difference CD as the fourth pass voltage Vpass4 applied to the third unselected word lines WLn−3 and WLn+3 decreases, a constant eighth pass voltage Vpass8 is applied to the third unselected word lines WLn−3 and WLn+3.

By lowering the rate of increase of the program voltage applied to the selected word line WLn, an excessive increase of the program voltage may be avoided, and the generation of leakage of the unselected memory cells may consequently be suppressed. In addition, by controlling the pass voltages applied to the first to third word lines WLn−1 to WLn−3 and WLn+1 to WLn+3 adjacent to the selected word line WLn, variations in threshold voltages of the first to third memory cells Fn−1 to Fn−3 and Fn+1 to Fn+3 adjacent to the selected memory cell Fn may be reduced during the program operation of the selected memory cell Fn.

Figure 9:
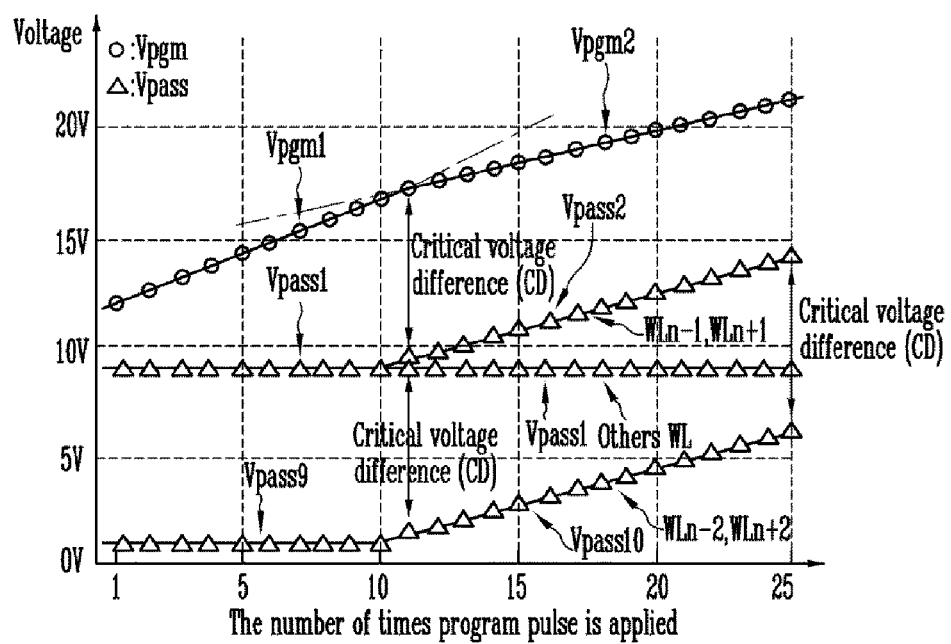
FIG. 9 is a graph illustrating a program method according to a sixth embodiment of the present invention.

FIG. 9 is a graph illustrating a program method according to a sixth embodiment of the present invention.

Referring to FIGS. 3 and 9, a program operation is performed by an Incremental Step Pulse Program (ISPP) method where a program voltage is gradually increased. During a program operation, a program enable voltage, e.g. a ground voltage, is applied to bit lines coupled to selected cell strings, while a program inhibit voltage, e.g. a power voltage, is applied to bit lines coupled to unselected cell strings. While the program enable voltage or the program inhibit voltage is applied to the bit lines, the first program voltage Vpgm1 being gradually increased is applied to the selected word line WLn, whereas the pass voltage is applied to the unselected word lines WLn−1 to WLn−k and WLn+1 to WLn+k.

At the initial stage of the program operation using the ISPP method, the voltage difference between the first program voltage Vpgm1 and the first pass voltage Vpass1 is smaller than the critical voltage difference CD, the first program voltage Vpgm1 being increased if necessary by the first step voltage is applied to the selected word line WLn coupled to the selected memory cells Fn, while the constant first pass voltage Vpass1 is applied to the unselected word lines WLn−1 to WLn−k and WLn+1 to WLn+k. A constant ninth pass voltage Vpass9 that has a lower voltage than the first pass voltage Vpass1 is applied to the second unselected word lines WLn−2 and WLn+2. For example, the constant ninth pass voltage Vpass9 may have a lower voltage than the first pass voltage Vpass1 by the critical voltage difference CD. The ninth pass voltage Vpass9 having a lower voltage than the first pass voltage Vpass1 is applied to the second unselected word lines WLn−2 and WLn+2 so as to avoid the decrease in threshold voltage of each of the first unselected memory cells Fn−1 and Fn+1 coupled to the first unselected word lines WLn−1 and WLn+1, respectively, caused by the first program voltage Vpgm1, in advance.

The critical voltage difference CD refers to the maximum voltage difference that does not cause the first unselected memory cells Fn−1 and Fn+1 most adjacent to the selected memory cell Fn to be erased due to the first program voltage Vpgm1 when the selected memory cell Fn is programmed. Since the critical voltage difference CD may differ between semiconductor devices, the critical voltage difference CD may be calculated by testing the semiconductor device. In this embodiment of the present invention, a description will be made to a case in which the critical voltage difference CD is 7.5 V.

When the first program voltage Vpgm1 applied to the selected word line WLn is 12 V and the first pass voltage Vpass1 is 9 V, the voltage difference between the first program voltage Vpgm1 and the first pass voltage Vpass1 is 3 V, which is lower than the critical voltage difference CD. Since the first unselected memory cells Fn−1 and Fn+1 most adjacent to the selected memory cell Fn are not affected by the first program voltage Vpgm1, the first pass voltage Vpass1 is applied to the entirety of the unselected word lines WLn−1, WLn−3 to WLn−k, WLn+1, and WLn+3 to WLn+k. When the threshold voltages of the selected memory cell Fn have not reached the target voltage, the first program voltage Vpgm1 is increased by the step voltage in proportion to the number of times the first program voltage Vpgm1 is applied until the voltage difference between the first program voltage Vpgm1 and the first pass voltage Vpass1 reaches the critical voltage difference CD, where each of the constant first and ninth pass voltages Vpass1 and Vpass9 are maintained.

As the program operation is being performed by applying the first program voltage Vpgm1 to the selected word line WLn, if the voltage difference between the first program voltage Vpgm1 and the first pass voltage Vpass1 reaches the critical voltage difference CD, the program operation continues to be performed by applying the second program voltage Vpgm2 with a corresponding second step voltage lower than the first step voltage increase. When the voltage difference between the first program voltage Vpgm1 and the first pass voltage Vpass1 reaches the critical voltage difference CD, the rate of increase of the first program voltage Vpgm1 is lowered to perform the program operation. For example, when the first step voltage increase is 0.5 V, the second step voltage increase is set to be within a range between 0 V to 0.5 V.

When the second program voltage Vpgm2 having a rate of increase lower than that of the first program voltage Vpgm1 is applied to the selected word line WLn, program efficiency of the selected memory cells coupled to the selected word line WLn may be deteriorated. When the second program voltage Vpgm2 is applied to the selected word line WLn, the threshold voltages of the selected memory cells may increase more slowly as compared to when the first program voltage Vpgm1 is applied thereto. In order to avoid a reduction in speed, the second pass voltage Vpass2 being gradually increased is applied to the first unselected word lines WLn−1 and WLn+1 most adjacent to both ends of the selected word line WLn, whereas a tenth pass voltage Vpass10 that is gradually increased is applied to the same second unselected word lines WLn−2 and WLn+2 to which the ninth pass voltage Vpass9 was applied. When the second or tenth pass voltages Vpass2 or Vpass10 being gradually increased are applied to the first unselected word lines WLn−1 and WLn+1 and second unselected word lines WLn−2 and WLn+2, the decrease in threshold voltage of each of the first unselected memory cells Fn−1 and Fn+1 may be avoided. Preferably, the step voltage increase of the second pass voltage Vpass2 may be substantially the same as the step voltage increase of the second program voltage Vpgm2. For example, when the second program voltage Vpgm2 is 0.3 V, both the second pass voltage Vpass2 and the tenth pass voltage Vpass10 are also increased by 0.3 V.

At this point, a constant first pass voltage Vpass1 level continues to be applied to the unselected word lines WLn−3 to WLn−k and WLn+3 to WLn+k except for the first and second unselected word lines WLn−1, WLn+1, WLn−2, and WLn+2.

By lowering the rate of increase of the program voltage applied to the selected word line WLn, an excessive increase in the program voltage may be avoided, and the generation of leakage of the unselected memory cells may consequently be suppressed. In addition, while the program operation is being performed by using the program voltage with a lower rate of increase, the pass voltage applied to the first unselected word lines WLn−1 and WLn+1 and the second unselected word lines WLn−2 and WLn+2 adjacent to the selected word line WLn is gradually increased to thereby compensate for a reduction of program efficiency of the selected memory cells.

Figure 10:
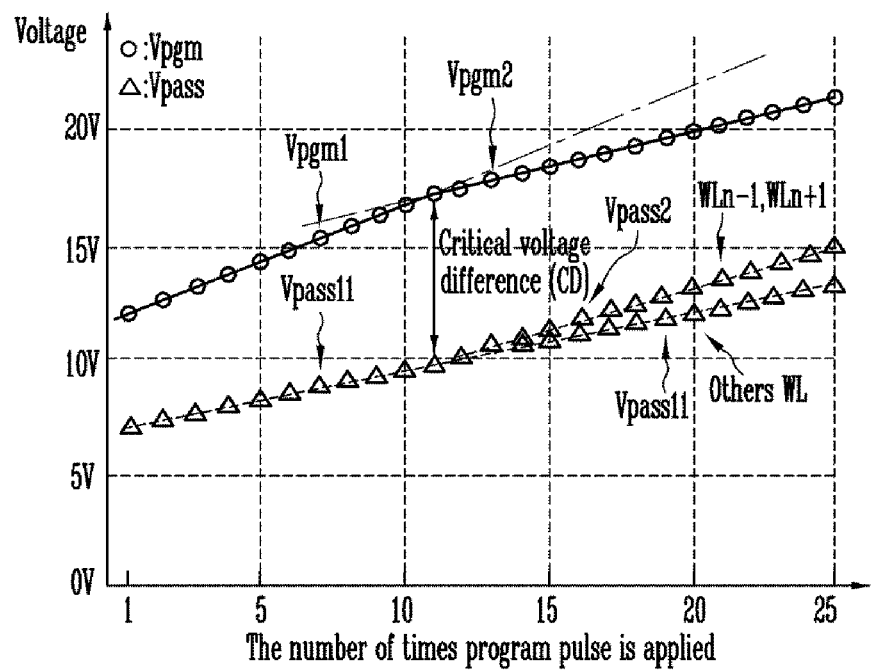
FIG. 10 is a graph illustrating a program method according to a seventh embodiment of the present invention.

FIG. 10 is a graph illustrating a method according to a seventh embodiment of the present invention.

Referring to FIGS. 3 and 10, a program operation is performed by an Incremental Step Pulse Program (ISPP) method where a program voltage is gradually increased. During a program operation, a program enable voltage, e.g. a ground voltage, is applied to bit lines coupled to selected cell strings, while a program inhibit voltage, e.g. a power voltage, is applied to bit lines coupled to unselected cell strings. While the program enable voltage or the program inhibit voltage is applied to the bit lines, the first program voltage Vpgm1 that is increased if necessary by a first step voltage is applied to the selected word line WLn, whereas an eleventh pass voltage Vpass11 that is gradually increased is applied to the unselected word lines WLn−1 to WLn−k and WLn+1 to WLn+k. The eleventh pass voltage Vpass11 has a rate of increase lower than the first program voltage Vpgm1.

The eleventh pass voltage Vpass11 being gradually increased is applied to the unselected word lines WLn−1 to WLn−k and WLn+1 to WLn+k so as to prevent unselected memory cells included in unselected cell strings ST from being erased due to the first program voltage. Since a program inhibit voltage Vcc is applied to bit lines coupled to the unselected cell strings ST, channel boosting is generated by the program inhibit voltage Vcc and the voltages applied to the word lines WLn−k to WLn+k. When voltage being gradually increased such as the eleventh pass voltage Vpass11 is applied, channel boosting is more efficiently generated to thereby increase channel potentials of the unselected cell strings.

At the initial stage of the program operation, a voltage difference between the first program voltage Vpgm1 and the eleventh pass voltage Vpass11 is smaller than the critical voltage difference CD. Therefore, the first program voltage Vpgm1 being increased as the first step voltage is applied to the selected word line WLn coupled to the selected memory cell Fn, while the eleventh pass voltage Vpass11 being gradually increased is applied to the unselected word lines WLn−1 to WLn−k and WLn+1 to WLn+k. Preferably, the rate of increase of the eleventh pass voltage Vpass11 may be lower than that of the first program voltage Vpgm1. The critical voltage difference CD refers to the maximum voltage difference that does not cause the first unselected memory cells Fn−1 and Fn+1 most adjacent to the selected memory cell Fn to be erased due to the first program voltage Vpgm1 when the selected memory cell Fn is programmed. Since the critical voltage difference CD may differ between semiconductor devices, the critical voltage difference CD may be calculated by testing the semiconductor device. In this embodiment of the present invention, a description will be made to a case in which the critical voltage difference CD is 7.5 V.

When the first program voltage Vpgm1 applied to the selected word line WLn is 12 V and the eleventh pass voltage Vpass11 is 7 V, the voltage difference between the first program voltage Vpgm1 and the eleventh pass voltage Vpass11 is 5 V, which is lower than the critical voltage difference CD.

Since the first unselected memory cells Fn−1 and Fn+1 most adjacent to the selected memory cell Fn are hardly affected by the first program voltage Vpgm1, the program operation is performed while the eleventh pass voltage Vpass11 continues to be applied to the entirety of the unselected word lines WLn−1 to WLn−k and WLn+1 to WLn+k.

As the program operation is being performed by applying the first program voltage Vpgm1 being gradually increased to the selected word line WLn, if the voltage difference between the first program voltage Vpgm1 and the eleventh pass voltage Vpass11 reaches the critical voltage difference CD, the program operation continues to be performed by applying the second program voltage Vpgm2 with a corresponding second step voltage lower than the first step voltage increase. When the voltage difference between the first program voltage Vpgm1 and the eleventh pass voltage Vpass11 reaches the critical voltage difference CD, the rate of increase of the program voltage is lowered to perform the program operation.

When the second program voltage Vpgm2 having the lowered rate of increase is applied to the selected word line WLn, the second pass voltage Vpass2 having a rate of increase higher than that of the eleventh pass voltage Vpass11 is applied to the first unselected word lines WLn−1 and WLn+1 most adjacent to both ends of the selected word line WLn. When the constant second program voltage Vpgm2 is applied to the selected word line WLn, if the rate of increase of the pass voltage being applied to the first unselected word lines WLn−1 and WLn+1 is increased, thereby suppressing the reduction in efficiency of the program operation caused by the second program voltage Vpgm2. Preferably, the step voltage increase of the second pass voltage Vpass2 may be substantially the same as the step voltage increase of the second program voltage Vpgm2. For example, when the step voltage increase is 0.3 V, the second pass voltage Vpass2 is also increased by 0.3 V.

At this point, the eleventh pass voltage Vpass11 continues to be applied to the other unselected word lines WLn−2 to WLn−k and WLn+2 to WLn+k except for the first unselected word lines WLn−1 and WLn+1.

By lowering the maximum value of the program voltage applied to the selected word line WLn, an excessive increase of the program voltage may be avoided, and the generation of leakage of the unselected memory cells may consequently be suppressed. In addition, while the program operation is being performed by using the program voltage with a lower rate of increase, the rate of increase of the pass voltage applied to the first unselected word lines WLn−1 and WLn+1 is increased to thereby avoid a reduction in program efficiency of the selected memory cells.

Figure 11:
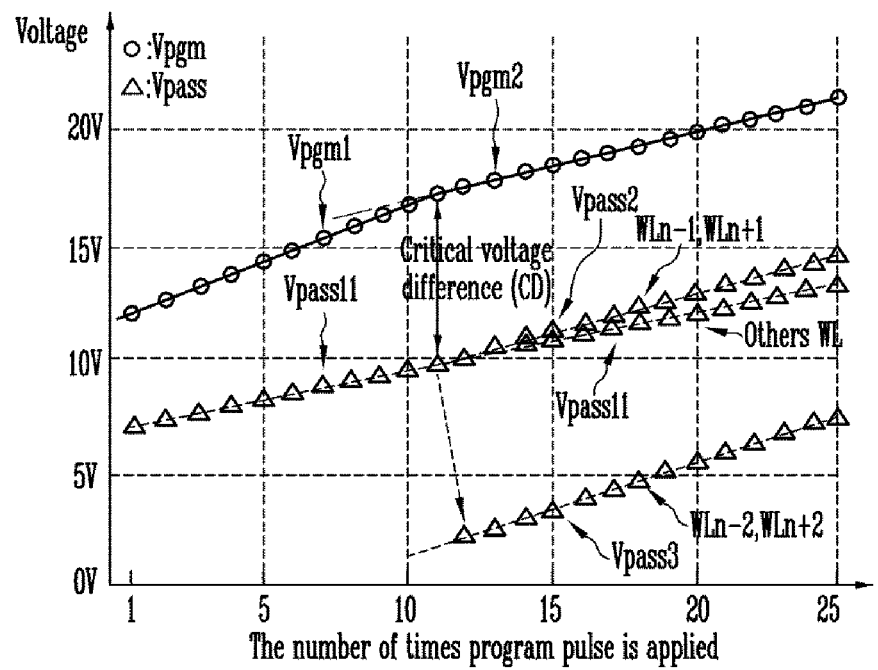
FIG. 11 is a graph illustrating a program method according to an eighth embodiment of the present invention.

FIG. 11 is a graph illustrating a program method according to an eighth embodiment of the present invention.

Referring to FIGS. 3 and 11, a program operation is performed by an Incremental Step Pulse Program (ISPP) method where a program voltage is gradually increased. During a program operation, a program enable voltage, e.g. a ground voltage is applied to bit lines coupled to selected cell strings, while a program inhibit voltage, e.g. a power voltage, is applied to bit lines coupled to unselected cell strings. While the program enable voltage or the program inhibit voltage is applied to the bit lines, the first program voltage Vpgm1 that is increased if necessary by a first step voltage is applied to the selected word line WLn, whereas the eleventh pass voltage Vpass11 being gradually increased is applied to the unselected word lines WLn−1 to WLn−k and WLn+1 to WLn+k. The eleventh pass voltage Vpass11 has a rate of increase lower than the first program voltage Vpgm1.

The eleventh pass voltage Vpass11 being gradually increased is applied to the unselected word lines WLn−1 to WLn−k and WLn+1 to WLn+k so as to prevent unselected memory cells included in unselected cell strings ST from being programmed due to the first program voltage Vpgm1 being gradually increased. Since the program inhibit voltage Vcc is applied to bit lines coupled to the unselected cell strings ST, channel boosting is generated by the program inhibit voltage Vcc and the voltages applied to the word lines WLn−k to WLn+k. When voltage being gradually increased such as the eleventh pass voltage Vpass11 is applied, channel boosting is more efficiently generated to thereby increase channel potentials of the unselected cell strings ST.

At the initial stage of the program operation, the voltage difference between the first program voltage Vpgm1 and the eleventh pass voltage Vpass11 is smaller than the critical voltage difference CD. Therefore, the first program voltage Vpgm1 being increased as the first step voltage is applied to the selected word line WLn coupled to the selected memory cell Fn, while the eleventh pass voltage Vpass11 is applied to the unselected word lines WLn−1 to WLn−k and WLn+1 to WLn+k, thereby performing the program operation. The critical voltage difference CD refers to the maximum voltage difference that does not cause the first unselected memory cells Fn−1 and Fn+1 most adjacent to the selected memory cell Fn to be erased due to the first program voltage Vpgm1 when the selected memory cell Fn is programmed. Since the critical voltage difference CD may differ between semiconductor devices, the critical voltage difference CD may be calculated by testing the semiconductor device. In this embodiment of the present invention, a description will be made to a case in which the critical voltage difference CD is 7.5 V.

When the first program voltage Vpgm1 applied to the selected word line WLn is 12 V and the eleventh pass voltage Vpass11 is 7 V, a voltage difference between the first program voltage Vpgm1 and the eleventh pass voltage Vpass11 is 5 V, which is lower than the critical voltage difference CD. Since the first unselected memory cells Fn−1 and Fn+1 most adjacent to the selected memory cell Fn are hardly affected by the first program voltage Vpgm1, the eleventh pass voltage Vpass11 continues to be applied to the entirety of the unselected word lines WLn−1 to WLn−k and WLn+1 to WLn+k. When the threshold voltages of the selected memory cells Fn have not reached the target voltage, the first program voltage Vpgm1 and the eleventh pass voltage Vpass11 gradually increase in proportion to the number of times the first program voltage Vpgm1 is applied until the voltage difference between the first program voltage Vpgm1 and the eleventh pass voltage Vpass11 reaches the critical voltage difference CD.

As the program operation is performed by applying the first program voltage Vpgm1 to the selected word line WLn, if the voltage difference between the first program voltage Vpgm1 and the eleventh pass voltage Vpass11 reaches the critical voltage difference CD, the program operation continues to be performed by applying the second program voltage Vpgm2 with a corresponding second step voltage lower than the first step voltage increase. When the voltage difference between the first program voltage Vpgm1 and the eleventh pass voltage Vpass11 reaches the critical voltage difference CD, the rate of increase of the program voltage is lowered to perform the program operation.

When the second program voltage Vpgm2 having the lowered rate of increase is applied to the selected word line WLn, the second pass voltage Vpass2 having a higher rate of increase than the eleventh pass voltage Vpass11 is applied to the first unselected word lines WLn−1 and WLn+1 most adjacent to both ends of the selected word line WLn. When the second program voltage Vpgm2 having the lower rate of increase is applied to the selected word line WLn, if the second pass voltage Vpass2 having the higher rate of increase is applied to the first unselected word lines WLn−1 and WLn+1, the threshold voltages of the selected memory cells can be easily increased. Preferably, the step voltage increase of the second pass voltage Vpass2 may be substantially the same as the step voltage increase of the second program voltage Vpgm2. For example, when the step voltage increase of the second program voltage Vpgm2 is 0.3 V, the second pass voltage Vpass2 is also increased by 0.3 V.

While the second pass voltage Vpass2 being gradually increased is applied to the first unselected word lines WLn−1 and WLn+1, the threshold voltages of the first unselected memory cells Fn−1 and Fn+1 coupled to the first unselected word lines WLn−1 and WLn+1, respectively, and second unselected memory cells Fn−2 and Fn+2 adjacent to the first unselected memory cells Fn−1 and Fn+1, respectively, may decrease. In order to suppress the increase in threshold voltage thereof, the third pass voltage Vpass3 that is lower than the eleventh pass voltage Vpass11 by the critical voltage difference CD is applied to the second unselected word lines WLn−2 and WLn+2 adjacent to the first unselected word lines WLn−1 and WLn+1, respectively. At this point, the eleventh pass voltage Vpass11 continues to be applied to the other unselected word lines WLn−3 to WLn−k and WLn+3 to WLn+k except for the first unselected word lines WLn−1 and WLn+1 and the second unselected word lines WLn−2 and WLn+2.

In other words, in order to avoid the decrease in threshold voltage of each of the first and second unselected memory cells Fn−1, Fn−2, Fn+1, and Fn+2 caused by the second pass voltage Vpass2 being gradually increased, the level of the eleventh pass voltage Vpass11 applied to the second unselected word lines WLn−2 and WLn+2 coupled to the second unselected memory cells Fn−2 and Fn+2, respectively, is lowered, and the third pass voltage Vpass3 being gradually increased is applied thereto. For example, when the step voltage increase of the second program voltage Vpgm2 is 0.3 V, the second pass voltage Vpass2 and the third pass voltage Vpass3 are also increased by 0.3 V.

By lowering the rate of increase of the program voltage applied to the selected word line WLn, an excessive increase in the program voltage may be avoided, and the generation of leakage of the unselected memory cells caused by a breakdown voltage may consequently be suppressed. In addition, while the program operation is being performed by using the program voltage having the lower rate of increase, the rate of increase of the pass voltage applied to the first unselected word lines WLn−1 and WLn+1 most adjacent to the selected word line WLn is increased to thereby compensate for a reduction of program efficiency of the selected memory cells. By applying the third pass voltage Vpass3 lower than the second pass voltage Vpss2 by the critical voltage difference CD to the second unselected word lines WLn−2 and WLn+2, the decrease in threshold voltage of each of the first and second unselected memory cells Fn−1, Fn−2, Fn+1, and Fn+2 may be avoided.

Figure 12:
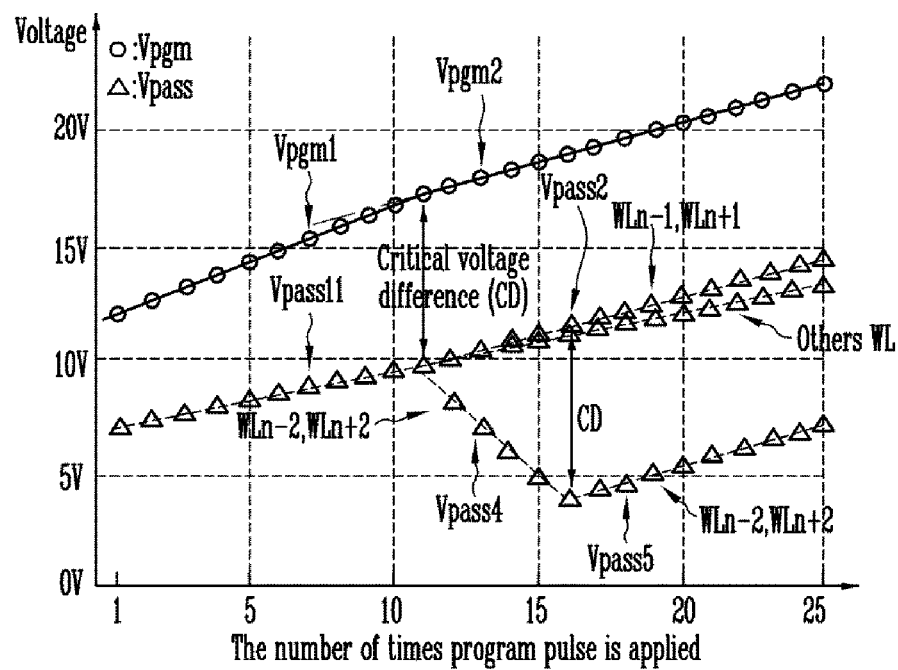
FIG. 12 is a graph illustrating a program method according to a ninth embodiment of the present invention.

FIG. 12 is a graph illustrating a program method according to a ninth embodiment of the present invention.

Referring to FIGS. 3 and 12, a program operation is performed by an Incremental Step Pulse Program (ISPP) method where a program voltage is gradually increased. During a program operation, a program enable voltage, e.g. a ground voltage, is applied to bit lines coupled to selected cell strings, while a program inhibit voltage, e.g. a power voltage, is applied to bit lines coupled to unselected cell strings. While the program enable voltage or the program inhibit voltage is applied to the bit lines, the first program voltage Vpgm1 being gradually increased is applied to the selected word line WLn, whereas the eleventh pass voltage Vpass11 being gradually increased is applied to the unselected word lines WLn−1 to WLn−k and WLn+1 to WLn+k. The eleventh pass voltage Vpass11 has a rate of increase lower than that of the first program voltage Vpgm1

The eleventh pass voltage Vpass11 being gradually increased is applied to the unselected word lines WLn−1 to WLn−k and WLn+1 to WLn+k so as to prevent unselected memory cells included in unselected cell strings ST from being erased due to the first program voltage Vpgm1 being gradually increased. Since the program inhibit voltage Vcc is applied to bit lines coupled to the unselected cell strings ST, channel boosting is generated by the program inhibit voltage Vcc and the voltages applied to the word lines WLn−k to WLn+k. When voltage being gradually increased such as the eleventh pass voltage Vpass11 is applied, channel boosting is more efficiently generated to thereby increase channel potentials.

At the initial stage of the program operation, the voltage difference between the first program voltage Vpgm1 and the eleventh pass voltage Vpass11 is smaller than the critical voltage difference CD. Therefore, the first program voltage Vpgm1 being gradually increased is applied to the selected word line WLn coupled to the selected memory cell Fn, while the eleventh pass voltage Vpass11 is applied to the unselected word lines WLn−1 to WLn−k and WLn+1 to WLn+k. The critical voltage difference CD refers to the maximum voltage difference that does not cause the first unselected memory cells Fn−1 and Fn+1 most adjacent to the selected memory cell Fn to be erased due to the first program voltage Vpgm1 when the selected memory cell Fn is programmed. Since the critical voltage difference CD may differ between semiconductor devices, the critical voltage difference CD may be calculated by testing the semiconductor device. In this embodiment of the present invention, a description will be made to a case in which the critical voltage difference CD is 7.5 V.

When the first program voltage Vpgm1 applied to the selected word line WLn is 12 V and the eleventh pass voltage Vpass11 is 7 V, the voltage difference between the first program voltage Vpgm1 and the eleventh pass voltage Vpass11 is 5 V, which is lower than the critical voltage difference CD. Since the first unselected memory cells Fn−1 and Fn+1 most adjacent to the selected memory cell Fn are hardly affected by the first program voltage Vpgm1, the eleventh pass voltage Vpass11 is applied to the entirety of the unselected word lines WLn−1 to WLn−k and WLn+1 to WLn+k. When the threshold voltages of the selected memory cell Fn have not reached the target voltage, the program operation is performed by gradually increasing the first program voltage Vpgm1 and the eleventh pass voltage Vpass11 in proportion to the number of times the first program voltage Vpgm1 is applied until the voltage difference between the first program voltage Vpgm1 and the eleventh pass voltage Vpass11 reaches the critical voltage difference CD.

As the program operation is being performed by applying the first program voltage Vpgm1 being increased to the selected word line WLn, if the voltage difference between the first program voltage Vpgm1 and the eleventh pass voltage Vpass11 reaches the critical voltage difference CD, the program operation is performed by applying the second program voltage Vpgm2 with a corresponding second step voltage lower than the first step voltage increase. When the voltage difference between the first program voltage Vpgm1 and the eleventh pass voltage Vpass11 reaches the critical voltage difference CD, the rate of increase of the program voltage is lowered to perform the program operation.

When the second program voltage Vpgm2 is increased as the second step voltage is applied to the selected word line WLn, program efficiency of the selected memory cells coupled to the selected word line WLn may be deteriorated. In order to avoid deterioration in program efficiency, the second pass voltage Vpass2 having the higher rate of increase is applied to the first unselected word lines WLn−1 and WLn+1 most adjacent to the selected word line WLn. When the second program voltage Vpgm2 having the higher rate of increase is applied to the selected word line WLn, if the second pass voltage Vpass2 having the higher rate of increase is applied to the first unselected word lines WLn−1 and WLn+1, a reduction in speed at which the threshold voltages of the selected memory cells increase may be avoided. The step voltage increase of the second pass voltage Vpass2 may be substantially the same as the step voltage increase of the second program voltage Vpgm2. For example, when the step voltage increase of the second program voltage Vpgm2 is 0.3 V, the second pass voltage Vpass2 is also increased by 0.3 V.

When the second pass voltage Vpass2 being gradually increased is applied to the first unselected word lines WLn−1 and WLn+1, the fourth pass voltage Vpass4 being gradually decreased is applied to the second unselected word lines WLn−2 and WLn+2 adjacent to the first unselected word lines WLn−1 and WLn+1, respectively. At this point, the eleventh pass voltage Vpass11 continues to be applied to the other unselected word lines WLn−3 to WLn−k and WLn+3 to WLn+k except for the first unselected word lines WLn−1 and WLn+1 most adjacent to the selected word line WLn and the next adjacent second unselected word lines WLn−2 and WLn+2.

The fourth pass voltage Vpass4 is applied to the second unselected word lines WLn−2 and WLn+2 adjacent to the first unselected word lines WLn−1 and WLn+1, respectively. In order to avoid the decrease in threshold voltage of each of the first and second unselected memory cells Fn−1, Fn−2, Fn+1, and Fn+2 caused by the second pass voltage Vpass2, the fourth pass voltage Vpass4 being decreased by a step voltage decrease is applied to the second unselected word lines WLn−2 and WLn+2 coupled to the second unselected memory cells Fn−2 and Fn+2, respectively. As for the fourth pass voltage Vpass4 specifically, when a coupling ratio by the word line coupled to the selected memory cell is 0.6 and a coupling ratio by the word line coupled to the neighboring memory cell is 0.15, the maximum step voltage decrease of the fourth pass voltage Vpass4 is 0.5V×(0.6/0.15)=2V. Therefore, preferably, the step voltage decrease of the fourth pass voltage Vpass4 may fall within a range between 0 V and 2 V.

Since the second pass voltage Vpass2 is gradually raised, and the fourth pass voltage Vpass4 is gradually lowered, the voltage difference between the second pass voltage Vpass2 and the fourth pass voltage Vpass4 may reach the critical voltage difference CD before the program operation is completed. When the voltage difference between the second pass voltage Vpass2 and the fourth pass voltage Vpass4 reaches the critical voltage difference CD, the fifth pass voltage Vpass5 that is gradually increased is applied to the same second unselected word lines WLn−2 and WLn+2 to which the fourth pass voltage Vpass4 was applied. That is, the voltage difference between the second pass voltage Vpass2 and the fourth pass voltage Vpass4 becomes far greater than the critical voltage difference CD, and the threshold voltages of the first unselected memory cells Fn−1 and Fn+1 may decrease due to the second pass voltage Vpass2 being gradually increased. In order to avoid the increase in the threshold voltage or the generation of leakage, the fifth pass voltage Vpass5 being increased is applied to the second unselected word lines WLn−2 and WLn+2. While the second or fifth pass voltages Vpass2 or Vpass5 are applied to the first and second unselected word lines WLn−1, WLn−2, WLn+1, and WLn+2, the eleventh pass voltage Vpass1 continues to be applied to the other unselected word lines WLn−3 to WLn−k and WLn+3 to WLn+k.

By lowering the rate of increase of the program voltage applied to the selected word line WLn, an excessive increase in the program voltage may be avoided, and the generation of leakage current may be suppressed. The pass voltage applied to the first unselected word lines WLn−1 and WLn+1 most adjacent to the selected word line WLn is gradually increased to thereby avoid a reduction in program efficiency of the selected memory cells. In addition, by controlling the pass voltage applied to second and third unselected word lines WLn−2, WLn−3, WLn+2, and WLn+3, changes in threshold voltages of the first to third unselected memory cells Fn−1 to Fn−3 and Fn+1 to Fn+3 caused by the second pass voltage Vpass2 applied to the first unselected word lines WLn−1 and WLn+1 may be reduced.

Figure 13:
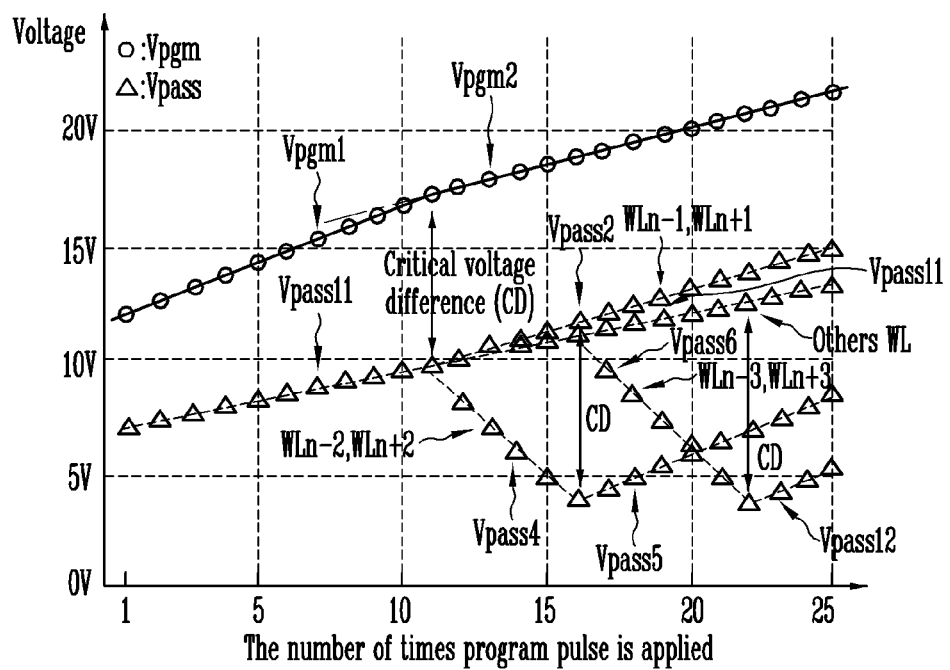
FIG. 13 is a graph illustrating a program method according to a tenth embodiment of the present invention.

FIG. 13 is a graph illustrating a program method according to a tenth embodiment of the present invention.

Referring to FIGS. 3 and 13, a program operation is performed by an Incremental Step Pulse Program (ISPP) method where a program voltage is gradually increased. During a program operation, a program enable voltage, e.g. ground voltage, is applied to bit lines coupled to selected cell strings, while a program inhibit voltage, e.g. a power voltage, is applied to bit lines coupled to unselected cell strings. While the program enable voltage or the program inhibit voltage is applied to the bit lines, the first program voltage Vpgm1 being gradually increased is applied to the selected word line WLn, whereas the eleventh pass voltage Vpass11 being gradually increased is applied to the unselected word lines WLn−1 to WLn−k and WLn+1 to WLn+k. The eleventh pass voltage Vpass11 has rate of increase lower than that of the first program voltage Vpgm1.

The eleventh pass voltage Vpass11 being gradually increased is applied to the unselected word lines WLn−1 to WLn−k and WLn+1 to WLn+k so as to prevent unselected memory cells included in unselected cell strings ST from being programmed due to the first program voltage Vpgm1 being gradually increased. Since the program inhibit voltage Vcc is applied to bit lines coupled to the unselected cell strings ST, channel boosting is generated by the program inhibit voltage Vcc and the voltages applied to the word lines WLn−k to WLn+k. When voltage being gradually increased such as the eleventh pass voltage Vpass11 is applied, channel boosting is more efficiently generated to thereby increase channel potentials.

At the initial stage of the program operation, a voltage difference between the first program voltage Vpgm1 and the eleventh pass voltage Vpass11 is smaller than the critical voltage difference CD. Therefore, the first program voltage Vpgm1 is applied to the selected word line WLn coupled to the selected memory cell Fn, while the eleventh pass voltage Vpass11 is applied to the unselected word lines WLn−1 to WLn−k and WLn+1 to WLn+k. The critical voltage difference CD refers to the maximum voltage difference that does not cause the first unselected memory cells Fn−1 and Fn+1 most adjacent to the selected memory cell Fn to be erased due to the first program voltage Vpgm1 when the selected memory cell Fn is programmed. Since the critical voltage difference CD may differ between semiconductor devices, the critical voltage difference CD may be calculated by testing the semiconductor device. In this embodiment of the present invention, a description will be made to a case in which the critical voltage difference CD is 7.5 V.

When the first program voltage Vpgm1 applied to the selected word line WLn is 12 V and the eleventh pass voltage Vpass11 is 7 V, the voltage difference between the first program voltage Vpgm1 and the eleventh pass voltage Vpass11 is 5 V, which is lower than the critical voltage difference CD. Since the first unselected memory cells Fn−1 and Fn+1 most adjacent to the selected memory cell Fn are hardly affected by the first program voltage Vpgm1, the eleventh pass voltage Vpass11 continues to be applied to the entirety of the unselected word lines WLn−1 to WLn−k and WLn+1 to WLn+k. When the threshold voltages of the selected memory cell Fn have not reached the target voltage, the first program voltage Vpgm1 and the eleventh pass voltage Vpass11 gradually increase in proportion to the number of times the first program voltage Vpgm1 is applied until the voltage difference between the first program voltage Vpgm1 and the eleventh pass voltage Vpass11 reaches the critical voltage difference CD.

As the program operation is being performed by applying the first program voltage Vpgm1 being increased to the selected word line WLn, if the voltage difference between the first program voltage Vpgm1 and the eleventh pass voltage Vpass11 reaches the critical voltage difference CD, the program operation is performed by applying the second program voltage Vpgm2 with a corresponding second step voltage lower than the first step voltage increase. When the voltage difference between the first program voltage Vpgm1 and the eleventh pass voltage Vpass11 reaches the critical voltage difference CD, the rate of increase of the program voltage applied to the selected word line WLn is lowered to perform the program operation.

When the second program voltage Vpgm2 is increased as the second step voltage is applied to the selected word line WLn, program efficiency of the selected memory cells coupled to the selected word line WLn may be deteriorated. In order to avoid deterioration in program efficiency, the second pass voltage Vpass2 being gradually increased is applied to the first unselected word lines WLn−1 and WLn+1 most adjacent to the selected word line WLn. When the second program voltage Vpgm2 having the lower rate of increase is applied to the selected word line WLn, if the second pass voltage Vpass2 having the higher rate of increase is applied to the first unselected word lines WLn−1 and WLn+1, the potentials of the selected memory cells are increased by the second pass voltage Vpass2 via coupling for example, thereby avoiding a reduction in efficiency of the program operation. Preferably, the step voltage increase of the second pass voltage Vpass2 may be substantially the same as the step voltage increase of the second program voltage Vpgm2. For example, when the step voltage increase of the second program voltage Vpgm2 is 0.3 V, the second pass voltage Vpass2 is also increased by 0.3 V.

When the second pass voltage Vpass2 being gradually increased is applied to the first unselected word lines WLn−1 and WLn+1, the fourth pass voltage Vpass4 being gradually decreased is applied to the second unselected word lines WLn−2 and WLn+2 adjacent to the first unselected word lines WLn−1 and WLn+1, respectively. At this point, the eleventh pass voltage Vpass11 continues to be applied to the other unselected word lines WLn−3 to WLn−k and WLn+3 to WLn+k except for the first unselected word lines WLn−1 and WLn+1 most adjacent to the selected word line WLn and the next adjacent second unselected word lines WLn−2 and WLn+2.

The fourth pass voltage Vpass4 is applied to the second unselected word lines WLn−2 and WLn+2 adjacent to the first unselected word lines WLn−1 and WLn+1, respectively. In order to avoid the decrease in threshold voltage of each of the first and second unselected memory cells Fn−1, Fn−2, Fn+1, and Fn+2 caused by the second pass voltage Vpass2, the fourth pass voltage Vpass4 that is decreased by a step voltage decrease is applied to the second unselected word lines WLn−2 and WLn+2 coupled to the second unselected memory cells Fn−2 and Fn+2, respectively. As for the fourth pass voltage Vpass4 specifically, when a coupling ratio by the word line coupled to the selected memory cell is 0.6 and a coupling ratio by the word line coupled to the neighboring memory cell is 0.15, the maximum step voltage decrease of the fourth pass voltage Vpass4 is 0.5V×(0.6/0.15)=2V. Therefore, preferably, the step voltage decrease of the fourth pass voltage Vpass4 may fall within a range between 0 V and 2 V.

Since the second pass voltage Vpass2 is gradually increased, and the fourth pass voltage Vpass4 is gradually decreased, the voltage difference between the second pass voltage Vpass2 and the fourth pass voltage Vpass4 may reach the critical voltage difference CD before the program operation is completed. After the voltage difference between the second pass voltage Vpass2 and the fourth pass voltage Vpass4 reaches the critical voltage difference CD, the fifth pass voltage Vpass5 being gradually increased is applied to the same second unselected word lines WLn−2 and WLn+2 to which the fourth pass voltage Vpass4 was applied such that the voltage difference between the second pass voltage Vpass2 and the fourth pass voltage Vpass4 may not exceed the critical voltage difference CD. In addition, the sixth pass voltage Vpass6 being gradually decreased is applied to the third unselected word lines WLn−3 and WLn+3 adjacent to the second unselected word lines WLn−2 and WLn+2, respectively.

When the voltage difference between the second pass voltage Vpass2 and the fourth pass voltage Vpass4 becomes far greater than the critical voltage difference CD, the threshold voltages of the first unselected memory cells Fn−1 and Fn+1 may decrease due to the second pass voltage Vpass2 being gradually increased. In order to avoid the decrease in the threshold voltage, the fifth pass voltage Vpass5 being gradually increased is applied to the second unselected word lines WLn−2 and WLn+2. When the second, fifth, or sixth pass voltages Vpass2, Vpass5, or Vpass6 are applied to the first to third unselected word lines WLn−1 to WLn−3 and WLn+1 to WLn+3 sequentially adjacent to the selected word line WLn, the eleventh pass voltage Vpass1 continues to be applied to the other unselected word lines WLn−4 to WLn−k and WLn+4 to WLn+k.

When the sixth pass voltage Vpass6 being gradually decreased is applied to the third unselected word lines WLn−3 and WLn+3, the voltage difference between the sixth pass voltage Vpass6 and the eleventh pass voltage Vpass11 may reach the critical voltage difference CD. After the voltage difference between the sixth pass voltage Vpass6 and the eleventh pass voltage Vpass11 reaches the critical voltage difference CD, in order to suppress a further increase in the voltage difference between the third unselected word lines WLn−3 and WLn+3 and the fourth word lines WLn−4 and WLn+4, a twelfth pass voltage Vpass11 that is gradually increased is applied to the third unselected word lines WLn−3 and WLn+3 having potentials reduced due to the sixth pass voltage Vpass6. The rate of increase of the twelfth pass voltage Vpass11 is substantially the same as that of the fifth pass voltage Vpass5.

By lowering the rate of increase of the program voltage applied to the selected word line WLn, an excessive increase in the program voltage may be avoided, and the generation of leakage current may consequently be suppressed. The pass voltages applied to the first to third unselected word lines WLn−1 to WLn−3 and WLn+1 to WLn+3 adjacent to the selected word line WLn are controlled to thereby reduce variations in threshold voltages of the first to third unselected memory cells Fn−1 to Fn−3 and Fn+1 to Fn+3 adjacent to the selected memory cell Fn during the program operation of the selected memory cell Fn.

Figure 14:
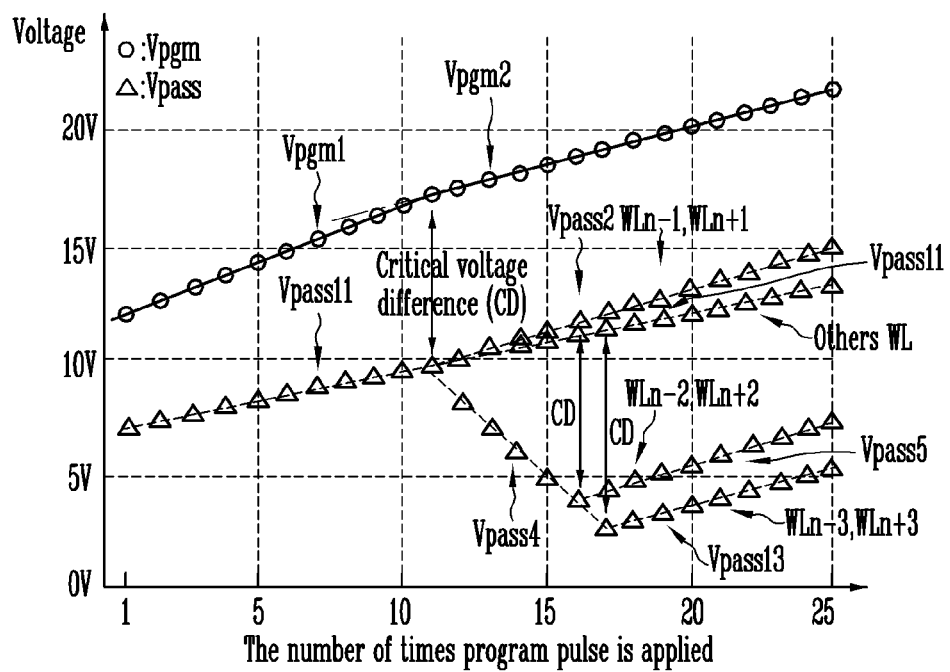
FIG. 14 is a graph illustrating a program method according to an eleventh embodiment of the present invention.

FIG. 14 is a graph illustrating a program method according to an eleventh embodiment of the present invention.

Referring to FIGS. 3 and 14, a program operation is performed by an Incremental Step Pulse Program (ISPP) method where a program voltage is gradually increased. During a program operation, a program enable voltage, e.g. a ground voltage, is applied to bit lines coupled to selected cell strings, while a program inhibit voltage, e.g. a power voltage, is applied to bit lines coupled to unselected cell strings. While the program enable voltage or the program inhibit voltage is applied to the bit lines, the first program voltage Vpgm1 being increased is applied to the selected word line WLn, whereas the eleventh pass voltage Vpass11 being gradually increased is applied to the unselected word lines WLn−1 to WLn−k and WLn+1 to WLn+k. The eleventh pass voltage Vpass11 has a rate of increase lower than that of the first program voltage Vpgm1.

The eleventh pass voltage Vpass11 being gradually increased is applied to the unselected word lines WLn−1 to WLn−k and WLn+1 to WLn+k so as to prevent unselected memory cells included in unselected cell strings ST from being erased due to the first program voltage Vpgm1 being gradually increased. Since the program inhibit voltage Vcc is applied to bit lines coupled to the unselected cell strings ST, channel boosting is generated by the program inhibit voltage Vcc and the voltages applied to the word lines WLn−k to WLn+k. When voltage being gradually increased such as the eleventh pass voltage Vpass11 is applied, channel boosting is more efficiently generated to thereby increase channel potentials.

At the initial stage of the program operation, the voltage difference between the first program voltage Vpgm1 and the eleventh pass voltage Vpass11 is smaller than the critical voltage difference CD. Therefore, the first program voltage Vpgm1 being gradually increased is applied to the selected word line WLn coupled to the selected memory cell Fn, while the eleventh pass voltage Vpass11 is applied to the unselected word lines WLn−1 to WLn−k and WLn+1 to WLn+k. The critical voltage difference CD refers to the maximum voltage difference that does not cause the first unselected memory cells Fn−1 and Fn+1 most adjacent to the selected memory cell Fn to be erased due to the first program voltage Vpgm1 when the selected memory cell Fn is programmed. Since the critical voltage difference CD may differ between semiconductor devices, the critical voltage difference CD may be calculated by testing the semiconductor device. In this embodiment of the present invention, a description will be made to a case in which the critical voltage difference CD is 7.5 V.

When the first program voltage Vpgm1 applied to the selected word line WLn is 12 V and the eleventh pass voltage Vpass11 is 7 V, a voltage difference between the first program voltage Vpgm1 and the eleventh pass voltage Vpass11 is 5 V, which is lower than the critical voltage difference CD. Since the first unselected memory cells Fn−1 and Fn+1 most adjacent to the selected memory cell Fn are not affected by the first program voltage Vpgm1, the eleventh pass voltage Vpass11 is applied to the entirety of the unselected word lines WLn−1 to WLn−k and WLn+1 to WLn+k. When the threshold voltages of the selected memory cell Fn have not reached the target voltage, the first program voltage Vpgm1 and the eleventh pass voltage Vpass11 gradually increase in proportion to the number of times the first program voltage Vpgm1 is applied until the voltage difference between the first program voltage Vpgm1 and the eleventh pass voltage Vpass11 reaches the critical voltage difference CD.

As the program operation is being performed by applying the first program voltage Vpgm1 being increased to the selected word line WLn, if the voltage difference between the first program voltage Vpgm1 and the eleventh pass voltage Vpass11 reaches the critical voltage difference CD, the second program voltage Vpgm2 with a corresponding second step voltage lower than the first step voltage increase is applied. When the voltage difference between the first program voltage Vpgm1 and the eleventh pass voltage Vpass11 reaches the critical voltage difference CD, the rate of increase of the program voltage is lowered to perform the program operation.

When the second program voltage Vpgm2 is increased as the second step voltage is applied to the selected word line WLn, program efficiency of the selected memory cells coupled to the selected word line WLn may be deteriorated. In order to avoid deterioration in program efficiency, the second pass voltage Vpass2 being gradually increased is applied to the first unselected word lines WLn−1 and WLn+1 most adjacent to the selected word line WLn. When the second program voltage Vpgm2 having the lower rate of increase is applied to the selected word line WLn, if the second pass voltage Vpass2 being gradually increased is applied to the first unselected word lines WLn−1 and WLn+1, a reduction in speed at which the threshold voltages of the selected memory cells increase due to the second pass voltage Vpass via coupling for example, may be suppressed. Preferably, the step voltage increase of the second pass voltage Vpass2 may be substantially the same as the step voltage increase of the second program voltage Vpgm2. For example, when the step voltage increase of the second program voltage Vpgm2 is 0.3 V, the second pass voltage Vpass2 is also increased by 0.3 V.

When the second pass voltage Vpass2 being gradually increased is applied to the first unselected word lines WLn−1 and WLn+1, the fourth pass voltage Vpass4 being gradually decreased is applied to the second and third unselected word lines WLn−2, WLn−3, WLn+2, and WLn+3 adjacent to the first unselected word lines WLn−1 and WLn+1. At this point, the eleventh pass voltage Vpass11 continues to be applied to the other unselected word lines WLn−4 to WLn−k and WLn+4 to WLn+k except for the first to third unselected word lines WLn−1 to WLn−3 and WLn+1 to WLn+3 adjacent to the selected word line WLn.

The fourth pass voltage Vpass4 is applied to the second unselected word lines WLn−2 and WLn+2 adjacent to the first unselected word lines WLn−1 and WLn+1, respectively. In order to avoid the decrease in threshold voltage of each of the first and second unselected memory cells Fn−1, Fn−2, Fn+1, and Fn+2 caused by the second pass voltage Vpass2, the fourth pass voltage Vpass4 being decreased by a step voltage decrease is applied to the second and third unselected word lines WLn−2, WLn−3, WLn+2, and WLn+3 coupled to the second and third unselected memory cells Fn−2, Fn−3, Fn+2, and Fn+3. As for the fourth pass voltage Vpass4 specifically, when a coupling ratio by the word line coupled to the selected memory cell is 0.6 and a coupling ratio by the word line coupled to the neighboring memory cell is 0.15, the maximum step voltage decrease of the fourth pass voltage Vpass4 is 0.5V×(0.6/0.15)=2V. Therefore, preferably, the step voltage decrease of the fourth pass voltage Vpass4 may fall within a range between 0 V and 2 V.

Since the second pass voltage Vpass2 is gradually increased, and the fourth pass voltage Vpass4 is gradually decreased, the voltage difference between the second pass voltage Vpass2 and the fourth pass voltage Vpass4 may reach the critical voltage difference CD before the program operation is completed. After the voltage difference between the second pass voltage Vpass2 and the fourth pass voltage Vpass4 reaches the critical voltage difference CD, the fifth pass voltage Vpass5 being gradually increased is applied to the same second unselected word lines WLn−2 and WLn+2 to which the fourth pass voltage Vpass4 was applied. The rate of increase of the fifth pass voltage is substantially the same as that of the second pass voltage Vpass2. Since the second unselected memory cells Fn−2 and Fn+2 are more affected by the second pass voltage Vpass2 applied to the first unselected word lines WLn−1 and WLn+1 than the third unselected memory cells Fn−3 and Fn+3, the influence of the second pass voltage Vpass may be reduced by increasing the potentials of the second unselected word lines WLn−2 and WLn+2 coupled to the second unselected memory cells Fn−2 and Fn+2. At this point, the eleventh pass voltage Vpass11 continues to be applied to the other unselected word lines WLn−4 to WLn−k and WLn+4 to WLn+k.

When the fourth pass voltage Vpass4 applied to the third unselected word lines WLn−3 and WLn+3 is reduced so that the voltage difference between the fourth pass voltage Vpass4 and the eleventh pass voltage Vpass11 reaches the critical voltage difference CD, a thirteenth pass voltage Vpass13 that is gradually increased is applied to the third unselected word lines WLn−3 and WLn+3. The thirteenth pass voltage Vpass13 gradually increases in proportion to the eleventh pass voltage Vpass11.

By lowering the rate of increase of the program voltage applied to the selected word line WLn, an excessive increase in the program voltage may be avoided, and the generation of leakage of the unselected memory cells may consequently be suppressed. In addition, the pass voltages applied to the first to third unselected word lines WLn−1 to WLn−3 and WLn+1 to WLn+3 adjacent to the selected word line WLn are controlled to thereby reduce variations in threshold voltages of the first to third unselected memory cells Fn−1 to Fn−3 and Fn+1 to Fn+3 adjacent to the selected memory cell Fn during the program operation of the selected memory cell Fn.

Figure 15:
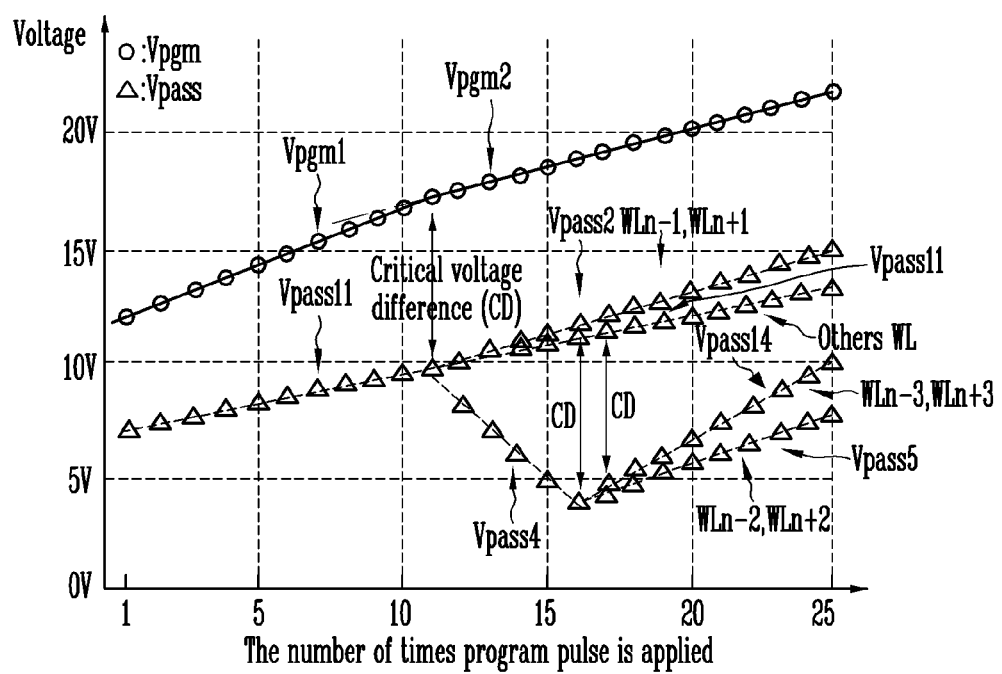
FIG. 15 is a graph illustrating a program method according to a twelfth embodiment of the present invention.

FIG. 15 is a graph illustrating a program method according to a twelfth embodiment of the present invention.

Referring to FIGS. 3 and 15, a program operation is performed by an Incremental Step Pulse Program (ISPP) method where a program voltage is gradually increased. During a program operation, a program enable voltage, e.g. a ground voltage, is applied to bit lines coupled to selected cell strings, while a program inhibit voltage, e.g. a power voltage, is applied to bit lines coupled to unselected cell strings. While the program enable voltage or the program inhibit voltage is applied to the bit lines, the first program voltage Vpgm1 being increased is applied to the selected word line WLn, whereas the eleventh pass voltage Vpass11 being gradually increased is applied to the unselected word lines WLn−1 to WLn−k and WLn+1 to WLn+k. The eleventh pass voltage Vpass11 has a rate of increase lower than that of the first program voltage Vpgm1.

The eleventh pass voltage Vpass11 being gradually increased is applied to the unselected word lines WLn−1 to WLn−k and WLn+1 to WLn+k so as to prevent unselected memory cells included in unselected cell strings ST from being erased due to the first program voltage Vpgm1 being gradually increased. Since the program inhibit voltage Vcc is applied to bit lines coupled to the unselected cell strings ST, channel boosting is generated by the program inhibit voltage Vcc and the voltages applied to the word lines WLn−k to WLn+k. When voltage being gradually increased such as the eleventh pass voltage Vpass11 is applied, channel boosting is more efficiently generated to thereby increase channel potentials.

At the initial stage of the program operation, the voltage difference between the first program voltage Vpgm1 and the eleventh pass voltage Vpass11 is smaller than the critical voltage difference CD. Therefore, the first program voltage Vpgm1 being gradually increased is applied to the selected word line WLn coupled to the selected memory cell Fn, while the eleventh pass voltage Vpass11 is applied to the unselected word lines WLn−1 to WLn−k and WLn+1 to WLn+k. The critical voltage difference CD refers to the maximum voltage difference that does not cause the first unselected memory cells Fn−1 and Fn+1 most adjacent to the selected memory cell Fn to be erased due to the first program voltage Vpgm1 when the selected memory cell Fn is programmed. Since the critical voltage difference CD may differ between semiconductor devices, the critical voltage difference CD may be calculated by testing the semiconductor device. In this embodiment of the present invention, a description will be made to a case in which the critical voltage difference CD is 7.5 V.

When the first program voltage Vpgm1 applied to the selected word line WLn is 12 V and the eleventh pass voltage Vpass11 is 7 V, a voltage difference between the first program voltage Vpgm1 and the eleventh pass voltage Vpass11 is 5 V, which is lower than the critical voltage difference CD. Since the first unselected memory cells Fn−1 and Fn+1 most adjacent to the selected memory cell Fn are not affected by the first program voltage Vpgm1, the eleventh pass voltage Vpass11 is applied to the entirety of the unselected word lines WLn−1 to WLn−k and WLn+1 to WLn+k. When the threshold voltages of the selected memory cell Fn have not reached the target voltage, the first program voltage Vpgm1 and the eleventh pass voltage Vpass11 gradually increase in proportion to the number of times the first program voltage Vpgm1 is applied until the voltage difference between the first program voltage Vpgm1 and the eleventh pass voltage Vpass11 reaches the critical voltage difference CD.

As the program operation is being performed by applying the first program voltage Vpgm1 being increased to the selected word line WLn, if the voltage difference between the first program voltage Vpgm1 and the eleventh pass voltage Vpass11 reaches the critical voltage difference CD, the second program voltage Vpgm2 with a corresponding second step voltage lower than the first step voltage increase is subsequently applied. When the voltage difference between the first program voltage Vpgm1 and the eleventh pass voltage Vpass11 reaches the critical voltage difference CD, the rate of increase of the program voltage is lowered to perform the program operation.

When the second program voltage Vpgm2 is increased as the second step voltage is applied to the selected word line WLn, program efficiency of the selected memory cells coupled to the selected word line WLn may be deteriorated. In order to avoid deterioration in program efficiency, the second pass voltage Vpass2 being gradually increased is applied to the first unselected word lines WLn−1 and WLn+1 most adjacent to the selected word line WLn. When the second program voltage Vpgm2 having the lower rate of increase is applied to the selected word line WLn, if the second pass voltage Vpass2 being gradually increased is applied to the first unselected word lines WLn−1 and WLn+1, a reduction in speed at which the threshold voltages of the selected memory cells increase due to the second pass voltage Vpass via coupilng for example, may be suppressed. Preferably, the step voltage increase of the second pass voltage Vpass2 may be substantially the same as the step voltage increase of the second program voltage Vpgm2. For example, when the step voltage increase of the second program voltage Vpgm2 is 0.3 V, the second pass voltage Vpass2 is also increased by 0.3 V.

When the second pass voltage Vpass2 being gradually increased is applied to the first unselected word lines WLn−1 and WLn+1, the fourth pass voltage Vpass4 being gradually decreased is applied to the second and third unselected word lines WLn−2, WLn−3, WLn+2, and WLn+3 adjacent to the first unselected word lines WLn−1 and WLn+1. At this point, the eleventh pass voltage Vpass11 continues to be applied to the other unselected word lines WLn−4 to WLn−k and WLn+4 to WLn+k except for the first to third unselected word lines WLn−1 to WLn−3 and WLn+1 to WLn+3 adjacent to the selected word line WLn.

The fourth pass voltage Vpass4 is applied to the second unselected word lines WLn−2 and WLn+2 adjacent to the first unselected word lines WLn−1 and WLn+1, respectively. In order to avoid the decrease in threshold voltage of each of the first and second unselected memory cells Fn−1, Fn−2, Fn+1, and Fn+2 caused by the second pass voltage Vpass2, the fourth pass voltage Vpass4 being decreased by a step voltage decrease is applied to the second and third unselected word lines WLn−2, WLn−3, WLn+2, and WLn+3 coupled to the second and third unselected memory cells Fn−2, Fn−3, Fn+2, and Fn+3, respectively. As for the fourth pass voltage Vpass4 specifically, when a coupling ratio by the word line coupled to the selected memory cell is 0.6 and a coupling ratio by the word line coupled to the neighboring memory cell is 0.15, the maximum step voltage decrease of the fourth pass voltage Vpass4 is $0.5V \times (0.6/0.15) = 2V$. Therefore, preferably, the step voltage decrease of the fourth pass voltage Vpass4 may fall within a range between 0 V and 2 V.

Since the second pass voltage Vpass2 is gradually increased, and the fourth pass voltage Vpass4 is gradually decreased, the voltage difference between the second pass voltage Vpass2 and the fourth pass voltage Vpass4 may reach the critical voltage difference CD before the program operation is completed. After the voltage difference between the second pass voltage Vpass2 and the fourth pass voltage Vpass4 reaches the critical voltage difference CD, the fifth pass voltage Vpass5 being gradually increased is applied to the same second unselected word lines WLn−2 and WLn+2 to which the fourth pass voltage Vpass4 was applied, whereas a fourteenth pass voltage Vpass14 that has higher rate of increase than that of the fifth pass voltage Vpass5 is applied to the third unselected word lines WLn−3 and WLn+3. For example, the rate of increase of the fourteenth pass voltage Vpass14 is substantially the same as that of the first program voltage Vpgm1. That is, the fourteenth pass voltage Vpass14 is increased as the first step voltage. At this point, the eleventh pass voltage Vpass11 continues to be applied to the other unselected word lines WLn−4 to WLn−k and WLn+4 to WLn+k.

By lowering the rate of increase of the program voltage applied to the selected word line WLn, an excessive increase in the program voltage may be avoided, and the generation of leakage current may consequently be suppressed. In addition, the pass voltages applied to the first to third unselected word lines WLn−1 to WLn−3 and WLn+1 to WLn+3 adjacent to the selected word line WLn are controlled to thereby reduce variations in threshold voltages of the first to third unselected memory cells Fn−1 to Fn−3 and Fn+1 to Fn+3 adjacent to the selected memory cell Fn during the program operation of the selected memory cell Fn.

According to embodiments of the present invention, unselected memory cells adjacent to a selected memory cell may be prevented from being erased during a program operation, and particularly, a decrease in threshold voltage of a memory cell having completed a program operation in the previous step may be avoided, thereby enhancing the reliability of a semiconductor device. In addition, after a program voltage being gradually increased reaches a predetermined level, the level of the program voltage is maintained at a constant level, thereby avoiding leakage that may occur in the unselected memory cell.

What is claimed is:

1. A method of operating a semiconductor device, the method comprising:
   programming selected memory cells by applying a first program voltage which is increased by a first step voltage to a selected word line and by applying a first pass voltage having a constant level to unselected word lines; and
   when a voltage difference between the first program voltage and the first pass voltage reaches a predetermined voltage difference, programming the selected memory cells by applying a second program voltage which is increased by a second step voltage lower than the first step voltage to the selected word line and by applying a second pass voltage which is increased in proportion to the second program voltage to first unselected word lines adjacent to the selected word line among the unselected word lines.

2. The method of claim 1, further comprising, when the second pass voltage is applied to the first unselected word lines, applying a third pass voltage lower than the first pass voltage by the predetermined voltage difference to second unselected word lines adjacent to the first unselected word lines to perform a program operation.

3. The method of claim 2, wherein the third pass voltage is increased in proportion to the second program voltage.

4. The method of claim 1, further comprising, when the second pass voltage is applied to the first unselected word lines, applying a fourth pass voltage which is decreased to second unselected word lines adjacent to the first unselected word lines among the unselected word lines; and
   applying a fifth pass voltage which is increased in proportion to the second program voltage to the second unselected word lines when a voltage difference between the fourth pass voltage and the second pass voltage reaches the predetermined voltage difference.

5. The method of claim 4, further comprising, when the fifth pass voltage is applied to the second unselected word lines,
   applying a decreasing sixth pass voltage to third unselected word lines adjacent to the second unselected word lines among the unselected word lines; and
   applying a seventh pass voltage having a constant level to the third unselected word lines when a voltage difference between the sixth pass voltage and the first pass voltage reaches the predetermined voltage difference.

6. The method of claim 1, further comprising, when the second pass voltage is applied to the first unselected word lines,
- applying a fourth pass voltage which is decreased to second and third unselected word lines sequentially adjacent to the first unselected word lines among the unselected word lines; and
- applying a fifth voltage which is increased in proportion to the second program voltage to the second unselected word lines when a voltage difference between the fourth pass voltage and the second pass voltage reaches the predetermined voltage difference; and
- applying the fourth pass voltage to the third unselected word lines until a voltage difference between the fourth pass voltage and the first pass voltage reaches the predetermined voltage difference.

7. The method of claim 6, wherein an eighth pass voltage having a constant level is applied to the third unselected word lines when the voltage difference between the fourth pass voltage and the first pass voltage reaches the predetermined voltage difference.

8. The method of claim 1, further comprising applying a ninth pass voltage having a constant level lower than the first pass voltage until the second program voltage is applied to the selected word line; and
- applying a tenth pass voltage which is increased in proportion to the second pass voltage after the second program voltage is applied to the selected word line.

9. The method of claim 8, wherein the ninth pass voltage is lower than the first pass voltage by the predetermined voltage difference.

* * * * *